(12) United States Patent
Maimon et al.

(10) Patent No.: US 12,628,437 B2
(45) Date of Patent: May 12, 2026

(54) INJECTION MOLDED, BLOW MOLDED, AND ROTATIONAL MOLDED ARTICLES THAT INTEGRALLY INCORPORATE A PHOTOVOLTAIC DEVICE, AND METHOD AND SYSTEM FOR PRODUCING SUCH ARTICLES

(71) Applicant: SOLARPAINT LTD., Yokneam Illit (IL)

(72) Inventors: Eran Maimon, Kibbutz Nahsholim (IL); Ramon Joseph Albalak, Haifa (IL)

(73) Assignee: SOLARPAINT LTD., Yokneam Illit (IL)

( * ) Notice: Subject to any disclaimer, the term of this patent is extended or adjusted under 35 U.S.C. 154(b) by 208 days.

(21) Appl. No.: 18/136,359

(22) Filed: Apr. 19, 2023

(65) Prior Publication Data

US 2023/0261125 A1 Aug. 17, 2023

Related U.S. Application Data

(63) Continuation-in-part of application No. PCT/IL2021/051269, filed on Oct. 27, 2021, which is
(Continued)

(51) Int. Cl.
*H10F 19/30* (2025.01)
*H10F 71/00* (2025.01)
*H10F 77/20* (2025.01)

(52) U.S. Cl.
CPC ............. *H10F 19/30* (2025.01); *H10F 71/00* (2025.01); *H10F 77/227* (2025.01)

(58) Field of Classification Search
CPC ........ H10F 19/30; H10F 71/00; H10F 77/227; H10F 19/804; H10F 19/902;
(Continued)

(56) References Cited

U.S. PATENT DOCUMENTS 4,038,104 A 7/1977 Tsutomu
4,053,327 A 10/1977 Meulenberg, Jr.
(Continued)

FOREIGN PATENT DOCUMENTS

CN 101747545 A 6/2010
CN 106877795 A 6/2017
(Continued)

OTHER PUBLICATIONS

European Search Report in patent application EP 21885522.9, dated Sep. 24, 2024.
(Continued)

*Primary Examiner* — Angelo Trivisonno

(74) *Attorney, Agent, or Firm* — AlphaPatent Associates Ltd.; Daniel J. Swirsky

(57) ABSTRACT

Injection molded, blow molded, and rotational molded articles that integrally incorporate an operable photovoltaic device, and method and system for producing such articles. A method includes: placing an operable photovoltaic device at an inner-side of a mold cavity of a mold; performing injection molding or reaction injection molding or blow molding or rotational molding, of raw plastic materials or raw polymeric materials; and forming a single or singular, monolithic, unified or uniform, molded article that integrally incorporates and fixedly holds and tightly secures, therein or thereon, the operable photovoltaic device, directly and securely and tightly via the solidified molded plastic or the solidified molded polymer that are adjacent to it.

14 Claims, 15 Drawing Sheets

Related U.S. Application Data a continuation-in-part of application No. 17/353,867, filed on Jun. 22, 2021, now Pat. No. 11,978,815, application No. 18/136,359 is a continuation of application No. 17/353,867, filed on Jun. 22, 2021, now Pat. No. 11,978,815, which is a continuation-in-part of application No. 16/362,665, filed on Mar. 24, 2019, now Pat. No. 11,081,606, said application No. 17/353,867 is a continuation-in-part of application No. PCT/IL2019/051416, filed on Dec. 26, 2019, which is a continuation-in-part of application No. 16/362,665, filed on Mar. 24, 2019, now Pat. No. 11,081,606, application No. 18/136,359 is a continuation-in-part of application No. 17/802,335, filed as application No. PCT/IL2021/050217 on Feb. 25, 2021, now abandoned.

(60) Provisional application No. 63/106,666, filed on Oct. 28, 2020, provisional application No. 62/785,282, filed on Dec. 27, 2018, provisional application No. 62/982,536, filed on Feb. 27, 2020.

(58) Field of Classification Search
CPC .... H10F 71/121; H10F 77/147; H10F 77/484; H10F 77/211; Y02E 10/52; Y02E 10/547; Y02P 70/50
USPC ........................................................ 136/251
See application file for complete search history.

(56) References Cited

U.S. PATENT DOCUMENTS

| | | | | |
|---|---|---|---|---|
| 4,352,948 | A | * | 10/1982 | Kaplow ................ H10F 77/147 136/246 |
| 4,830,038 | A | * | 5/1989 | Anderson ............... H10F 19/80 264/272.17 |
| 5,994,641 | A | | 11/1999 | Kardauskas |
| 6,291,761 | B1 | * | 9/2001 | Takada .................. H10F 77/148 136/246 |
| 8,742,252 | B2 | * | 6/2014 | Buller ................... H10F 77/147 136/246 |
| 9,379,277 | B2 | | 6/2016 | Lin |
| 10,566,481 | B2 | | 2/2020 | Iwamoto |
| 2007/0199588 | A1 | | 8/2007 | Rubin |
| 2008/0276983 | A1 | | 11/2008 | Drake |
| 2008/0302408 | A1 | | 12/2008 | Bressler |
| 2011/0100451 | A1 | | 5/2011 | Krause |
| 2011/0183540 | A1 | | 7/2011 | Keenihan |
| 2012/0151856 | A1 | | 6/2012 | Azoulay |
| 2013/0000701 | A1 | * | 1/2013 | Mottelet ................ H10F 19/80 136/251 |
| 2014/0167677 | A1 | | 6/2014 | Voelkner |
| 2014/0283898 | A1 | | 9/2014 | Pilat |
| 2015/0053265 | A1 | | 2/2015 | Gaume |
| 2016/0035911 | A1 | | 2/2016 | Barruel |
| 2016/0247959 | A1 | | 8/2016 | Wiedeman |
| 2017/0250299 | A1 | | 8/2017 | Arrizabalaga Canellada |
| 2019/0081592 | A1 | | 3/2019 | Oldridge |
| 2019/0319148 | A1 | | 10/2019 | Zhu |
| 2020/0212238 | A1 | | 7/2020 | Maimon |
| 2021/0313478 | A1 | | 10/2021 | Maimon |

FOREIGN PATENT DOCUMENTS

| | | |
|---|---|---|
| CN | 109659382 A | 4/2019 |
| EP | 3712964 A1 | 9/2020 |
| JP | 2013077708 A | 4/2013 |
| JP | 2018110160 A | 7/2018 |
| WO | 2011/116144 A1 | 9/2011 |
| WO | 2017/186120 A2 | 11/2017 |
| WO | 2020/187792 A1 | 9/2020 |

OTHER PUBLICATIONS

Machine Translation of CN 109659382 A Printed from "Google Patents" on May 5, 2025, from: https://patents.google.com/patent/CN109659382A/en.

Machine Translation of WO 2017/186120 A2 Printed from "Google Patents" on May 5, 2025, from: https://patents.google.com/patent/WO2017186120A2/en.

Machine Translation of JP 2013077708 A Printed from "Google Patents" on May 5, 2025, from: https://patents.google.com/patent/JP2013077708A/en.

Machine Translation of JP 2018110160 A Printed from "Google Patents" on May 5, 2025, from: https://patents.google.com/patent/JP2018110160A/en.

Machine Translation of CN 106877795 A Printed from "Google Patents" on May 5, 2025, from: https://patents.google.com/patent/CN106877795A/en.

Machine Translation of CN 101747545 A Printed from "Google Patents" on May 5, 2025, from: https://patents.google.com/patent/CN101747545A/en.

International Search Report in PCT/IL2021/051269, dated Jan. 10, 2022.

Written Opinion of the International Searching Authority in PCT/IL2021/051269, dated Jan. 12, 2022.

International Search Report in PCT/IL2019/051416, dated May 5, 2020.

Written Opinion of the International Searching Authority in PCT/IL2019/051416, dated May 5, 2020.

International Search Report in PCT/IL2021/050217, dated Jun. 22, 2021.

Written Opinion of the International Searching Authority in PCT/IL2021/050217, dated Jun. 22, 2021.

Office Action dated Sep. 30, 2025 in patent application KR 10-2023-7017516; with its machine translation to English.

* cited by examiner

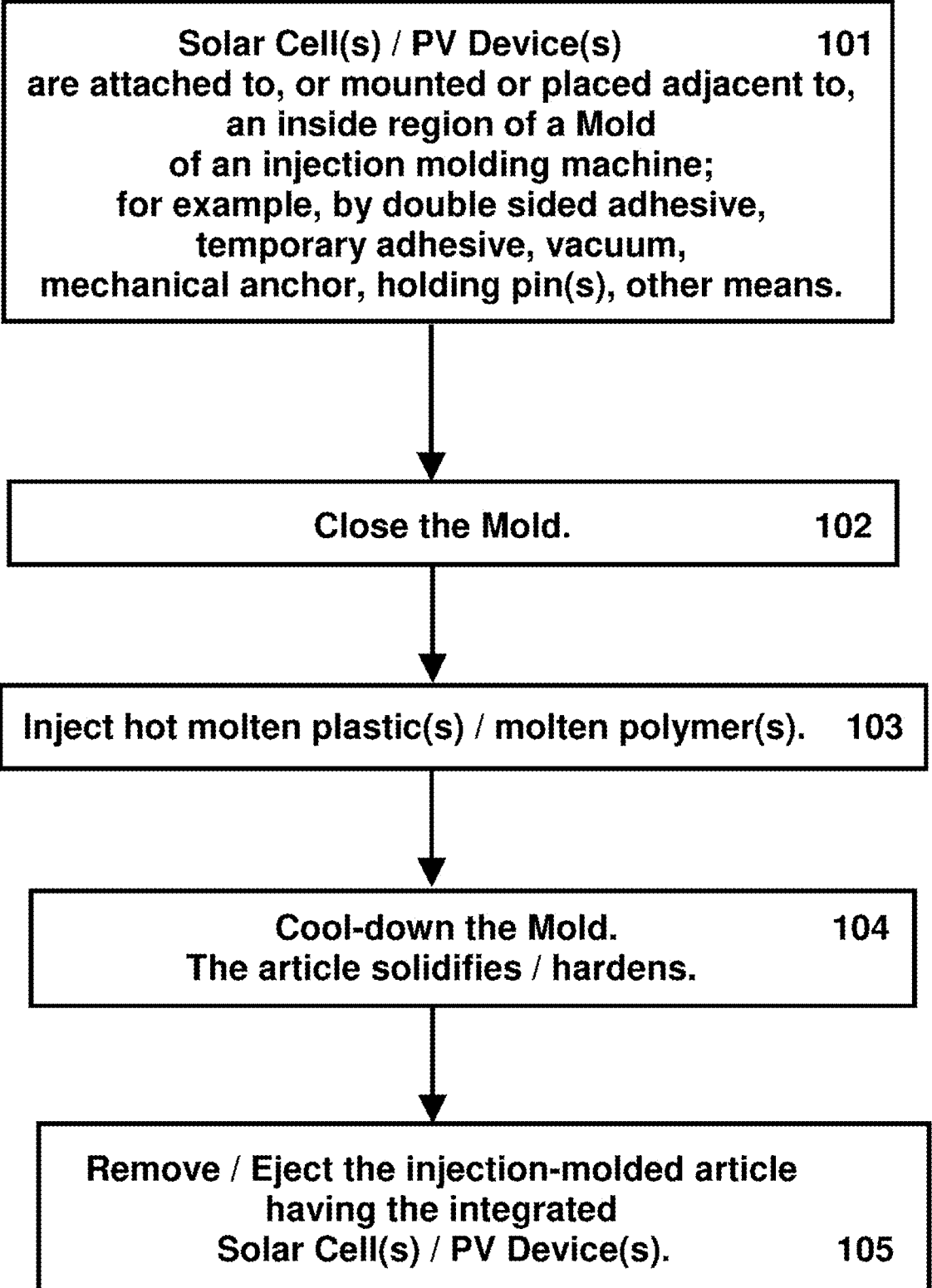

Solar Cell(s) / PV Device(s)          101
are attached to, or mounted or placed adjacent to,
an inside region of a Mold
of an injection molding machine;
for example, by double sided adhesive,
temporary adhesive, vacuum,
mechanical anchor, holding pin(s), other means.

Close the Mold.          102

Inject hot molten plastic(s) / molten polymer(s).          103

Cool-down the Mold.          104
The article solidifies / hardens.

Remove / Eject the injection-molded article
having the integrated
Solar Cell(s) / PV Device(s).          105

Fig. 1

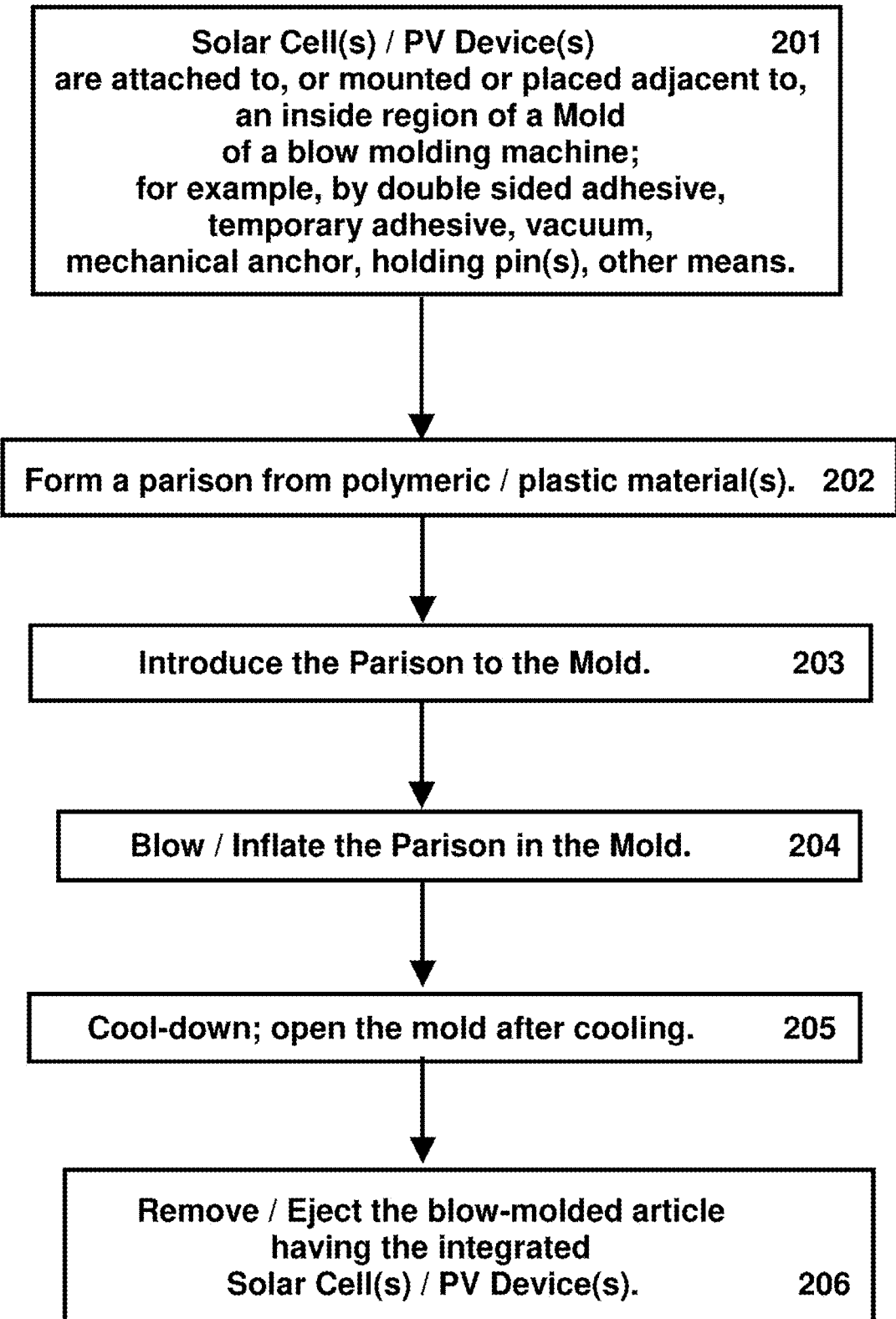

Solar Cell(s) / PV Device(s)     201
are attached to, or mounted or placed adjacent to,
an inside region of a Mold
of a blow molding machine;
for example, by double sided adhesive,
temporary adhesive, vacuum,
mechanical anchor, holding pin(s), other means.

Form a parison from polymeric / plastic material(s).   202

Introduce the Parison to the Mold.     203

Blow / Inflate the Parison in the Mold.     204

Cool-down; open the mold after cooling.     205

Remove / Eject the blow-molded article
having the integrated
Solar Cell(s) / PV Device(s).     206

Fig. 2

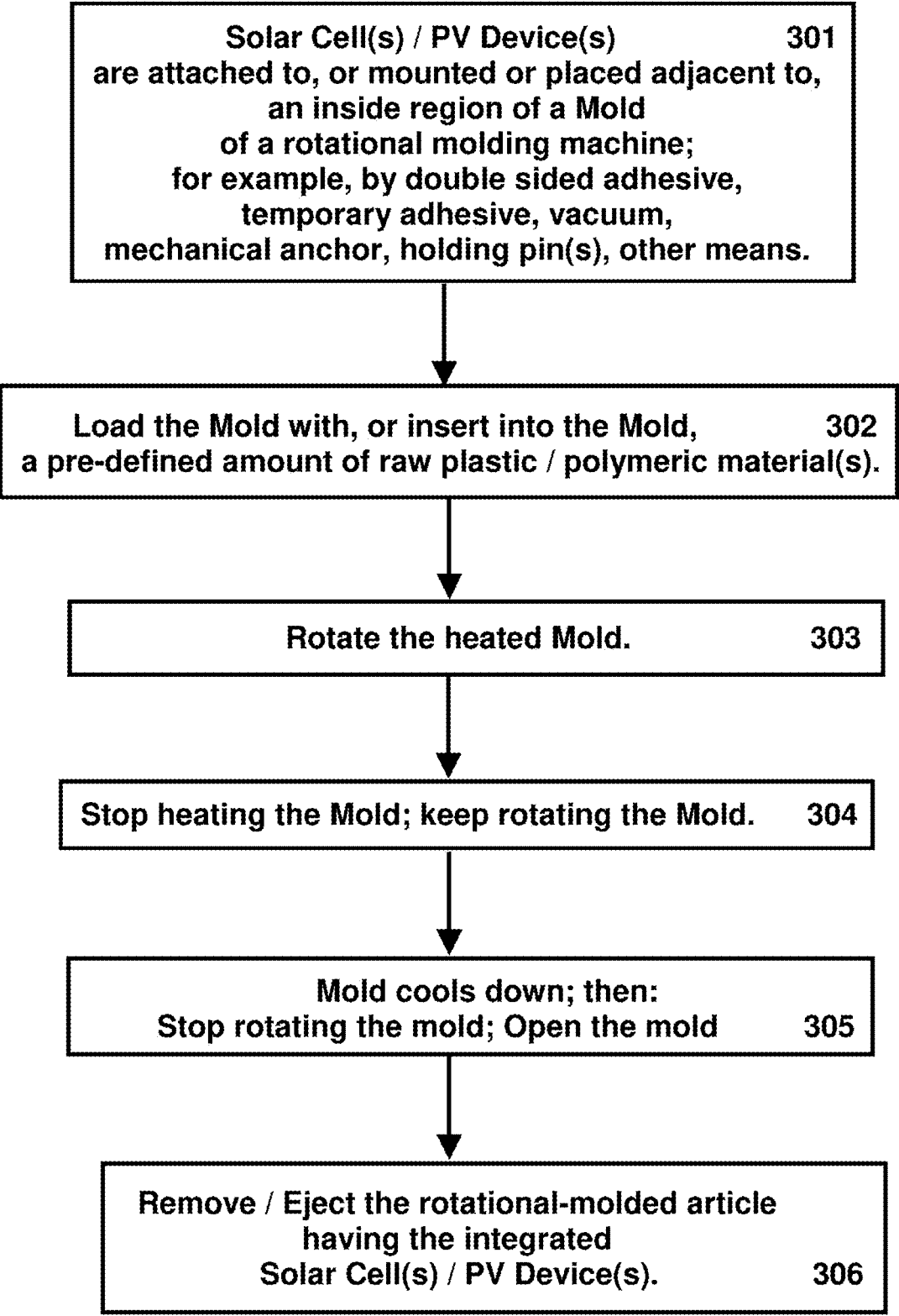

Solar Cell(s) / PV Device(s)          301
are attached to, or mounted or placed adjacent to,
an inside region of a Mold
of a rotational molding machine;
for example, by double sided adhesive,
temporary adhesive, vacuum,
mechanical anchor, holding pin(s), other means.

Load the Mold with, or insert into the Mold,          302
a pre-defined amount of raw plastic / polymeric material(s).

Rotate the heated Mold.          303

Stop heating the Mold; keep rotating the Mold.          304

Mold cools down; then:
Stop rotating the mold; Open the mold          305

Remove / Eject the rotational-molded article
having the integrated
Solar Cell(s) / PV Device(s).          306

Fig. 3

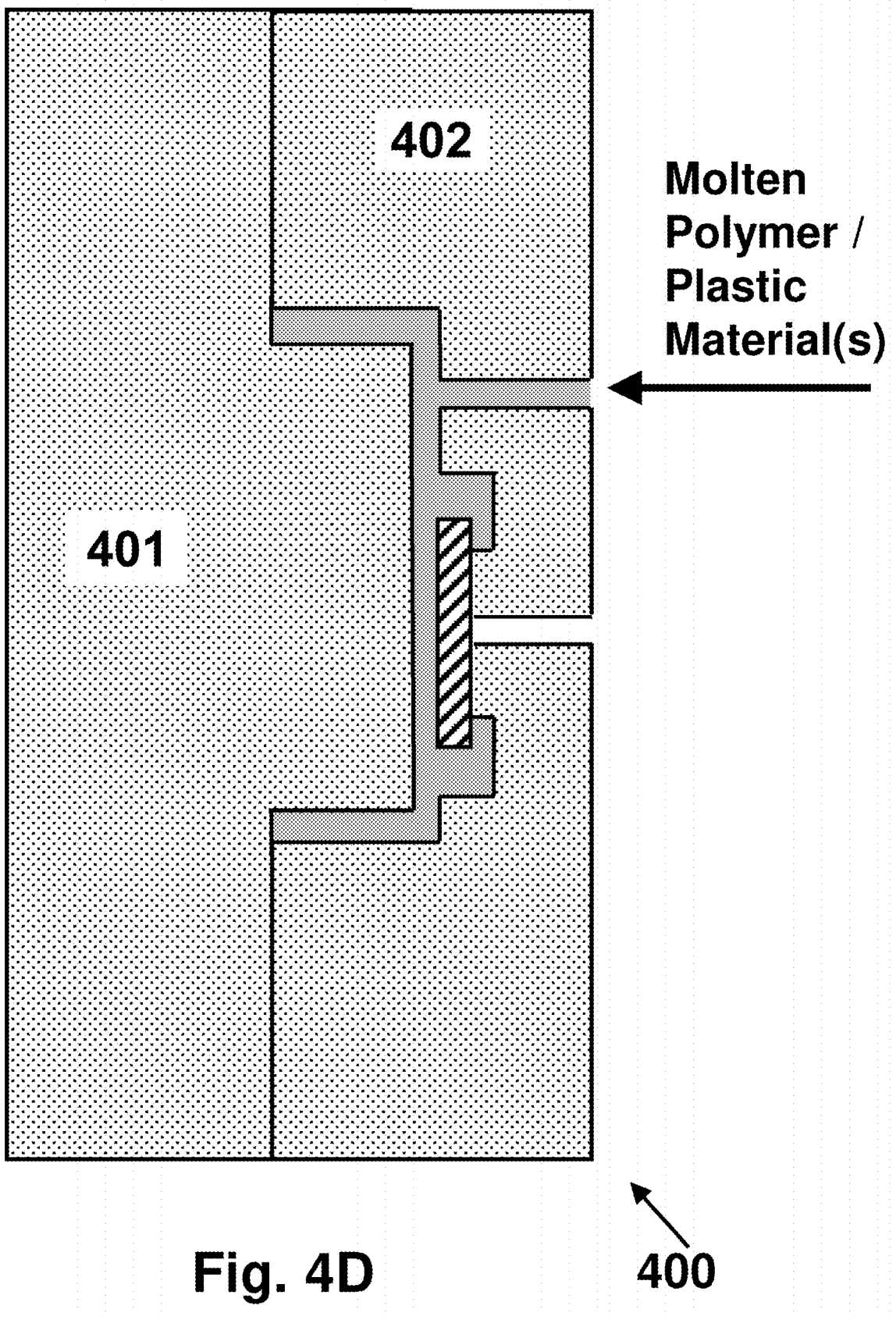
Molten Polymer / Plastic Material(s)
402
401
Fig. 4D     400

402

401

455

400

455

Glue Protrusion /
Spill-over 511

Non-Flush
Surface
514

Glue Gap /
Lacking Glue
512

PV Device 502

Plastic Body 503

Glue Connection 510

Glue
Gap(s)
515

501

Glue Protrusion / Spill-over 511

Non-Flush Surface 516

Glue Gap / Lacking Glue 512

PV Device 502

Plastic Body 503

Glue Connection 510

Glue Gap(s) 515

521

Screw / Nail / Pin

533

PV Device 502

Plastic Body 503

530

Figures 6A, 6B, 6C:
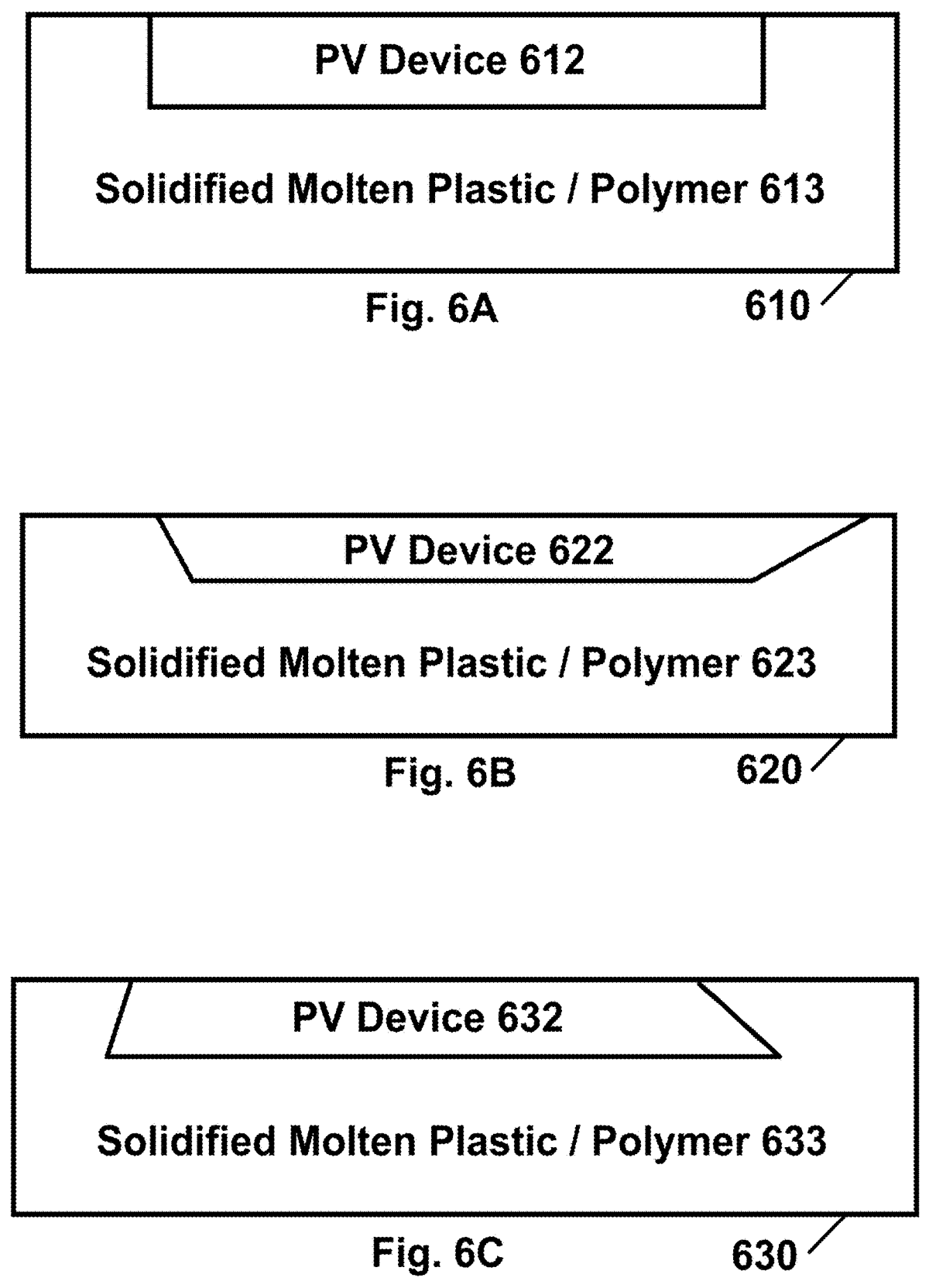

PV Device 612

Solidified Molten Plastic / Polymer 613

Fig. 6A    610

PV Device 622

Solidified Molten Plastic / Polymer 623

Fig. 6B    620

PV Device 632

Solidified Molten Plastic / Polymer 633

Fig. 6C    630

Figures 6D, 6E, 6F:
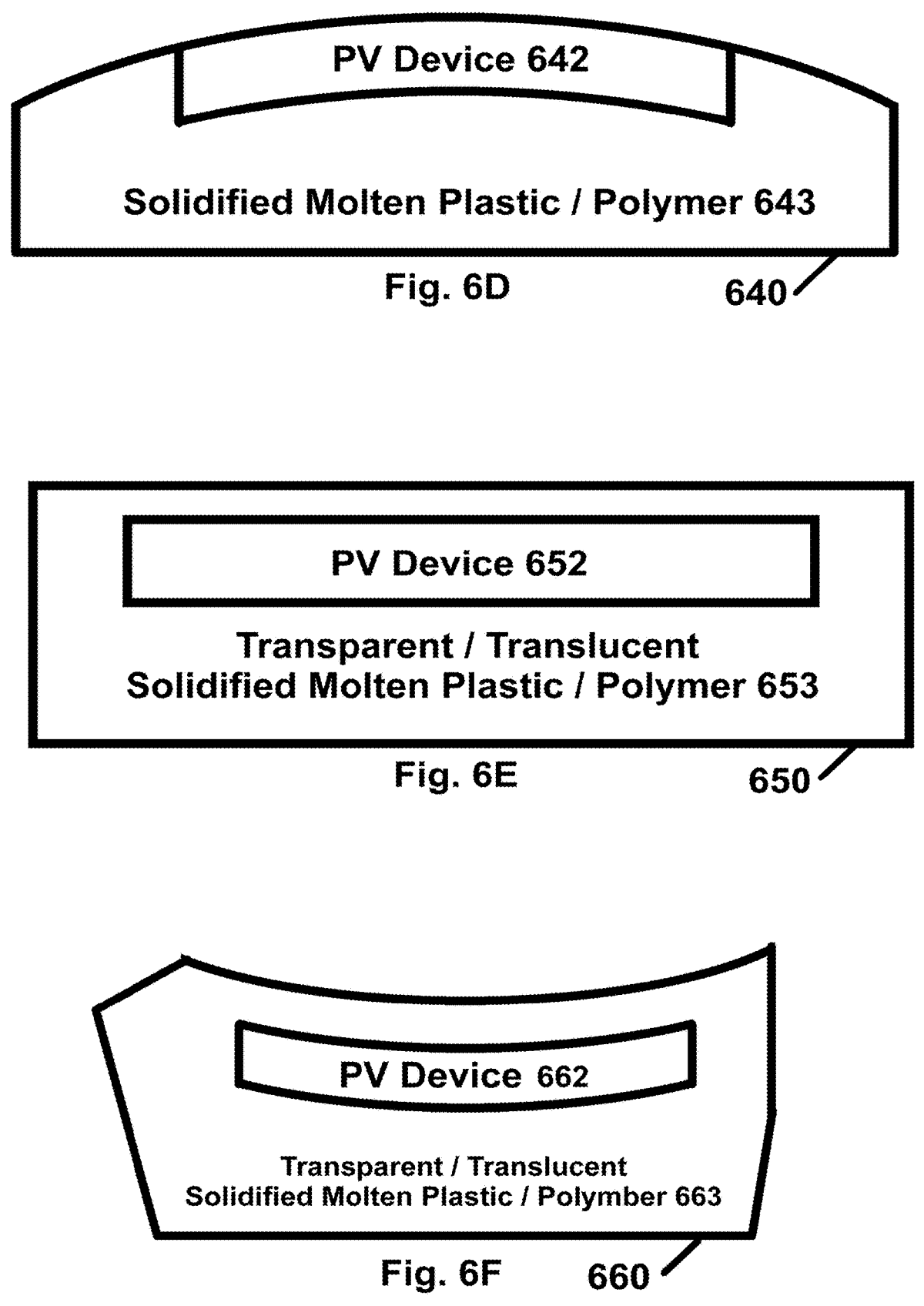

PV Device 642

Solidified Molten Plastic / Polymer 643

Fig. 6D    640

PV Device 652

Transparent / Translucent
Solidified Molten Plastic / Polymer 653

Fig. 6E    650

PV Device 662

Transparent / Translucent
Solidified Molten Plastic / Polymber 663

INJECTION MOLDED, BLOW MOLDED, AND ROTATIONAL MOLDED ARTICLES THAT INTEGRALLY INCORPORATE A PHOTOVOLTAIC DEVICE, AND METHOD AND SYSTEM FOR PRODUCING SUCH ARTICLES

CROSS-REFERENCE TO RELATED APPLICATIONS

This patent application is a Continuation of PCT international application number PCT/IL2021/051269, having an international filing date of Oct. 27, 2021, which is hereby incorporated by reference in its entirety.

The above-mentioned PCT/IL2021/051269 claims priority and benefit: (i) from U.S. 63/106,666, filed on Oct. 28, 2020, which is hereby incorporated by reference in its entirety; and also, (ii) from U.S. Ser. No. 17/353,867, filed on Jun. 22, 2021, which is hereby incorporated by reference in its entirety.

This patent application is also a Continuation-in-Part (CIP) of U.S. Ser. No. 17/353,867, filed on Jun. 22, 2021, which is hereby incorporated by reference in its entirety.

The above-mentioned U.S. Ser. No. 17/353,867 is a Continuation-in-Part (CIP) of U.S. Ser. No. 16/362,665, filed on Mar. 24, 2019, now U.S. Pat. No. 11,081,606 (issued on Aug. 3, 2021), which is hereby incorporated by reference in its entirety; which claims priority and benefit from U.S. 62/785,282, filed on Dec. 27, 2018, which is hereby incorporated by reference in its entirety.

The above-mentioned U.S. Ser. No. 17/353,867 is also a Continuation-in-Part (CIP) of PCT international application number PCT/IL2019/051416, having an international filing date of Dec. 26, 2019, published as international publication number WO 2020/136653 A1, which is hereby incorporated by reference in its entirety.

The above-mentioned PCT/IL2019/051416 claims priority and benefit (I) from U.S. Ser. No. 16/362,665, filed on Mar. 24, 2019, now U.S. Pat. No. 11,081,606 (issued on Aug. 3, 2021), which is hereby incorporated by reference in its entirety, and (II) from U.S. 62/785,282, filed on Dec. 27, 2018, which is hereby incorporated by reference in its entirety.

This patent application is also a Continuation-in-Part (CIP) of U.S. Ser. No. 17/802,335, filed on Aug. 25, 2022, which is hereby incorporated by reference in its entirety; which is a National Stage of PCT international application number PCT/IL2021/050217, having an international filing date of Feb. 25, 2021, published as international publication number WO 2021/171298 A1, which is hereby incorporated by reference in its entirety; which claims priority and benefit from U.S. 62/982,536, filed on Feb. 27, 2020, which is hereby incorporated by reference in its entirety.

FIELD

Some embodiments relate to the field of solar panels and photovoltaic (PV) devices.

BACKGROUND

The photovoltaic (PV) effect is the creation of voltage and electric current in a material upon exposure to light. It is a physical and chemical phenomenon.

The PV effect has been used in order to generate electricity from sunlight. For example, PV solar panels absorb sunlight or light energy or photons, and generate current electricity through the PV effect.

SUMMARY

Some embodiments provide an injection-molded article or a blow-molded article or a rotational-molded article, having a Photovoltaic (PV) cell or a PV device that is integrally embedded therein and/or that is integrally incorporated therein; as well as methods and systems for producing such articles.

Injection molded, blow molded, and rotational molded articles that integrally incorporate a photovoltaic device, and method and system for producing such articles. A method includes: placing an operable photovoltaic device at an inner-side of a mold cavity of a mold; performing injection molding or blow molding or rotational molding of raw plastic materials or raw polymeric materials; and thus forming a single, monolithic, unified, molded article that integrally holds therein or thereon the operable photovoltaic device.

Some embodiments may provide other and/or additional benefits and/or advantages.

BRIEF DESCRIPTION OF THE DRAWINGS

FIG. 1 is a flow-chart of a method of producing via injection molding a plastic or polymeric article having integrated PV device(s), in accordance with some embodiments.

FIG. 2 is a flow-chart of a method of producing via blow molding a plastic or polymeric article (e.g., a hollow or partially-hollow plastic or polymeric article) having integrated PV device(s), in accordance with some embodiments.

FIG. 3 is a flow-chart of a method of producing via rotational molding a plastic or polymeric article (e.g., a hollow or partially-hollow plastic or polymeric article) having integrated PV device(s), in accordance with some embodiments FIGS. 4A to 4G are schematic illustrations demonstrating components and operational steps of an injection molding system, in accordance with some demonstrative embodiments.

FIGS. 6A to 6F are schematic side-view illustrations of several monolithic molded articles, in accordance with some embodiments.

DETAILED DESCRIPTION OF SOME DEMONSTRATIVE EMBODIMENTS

Figure 4A:
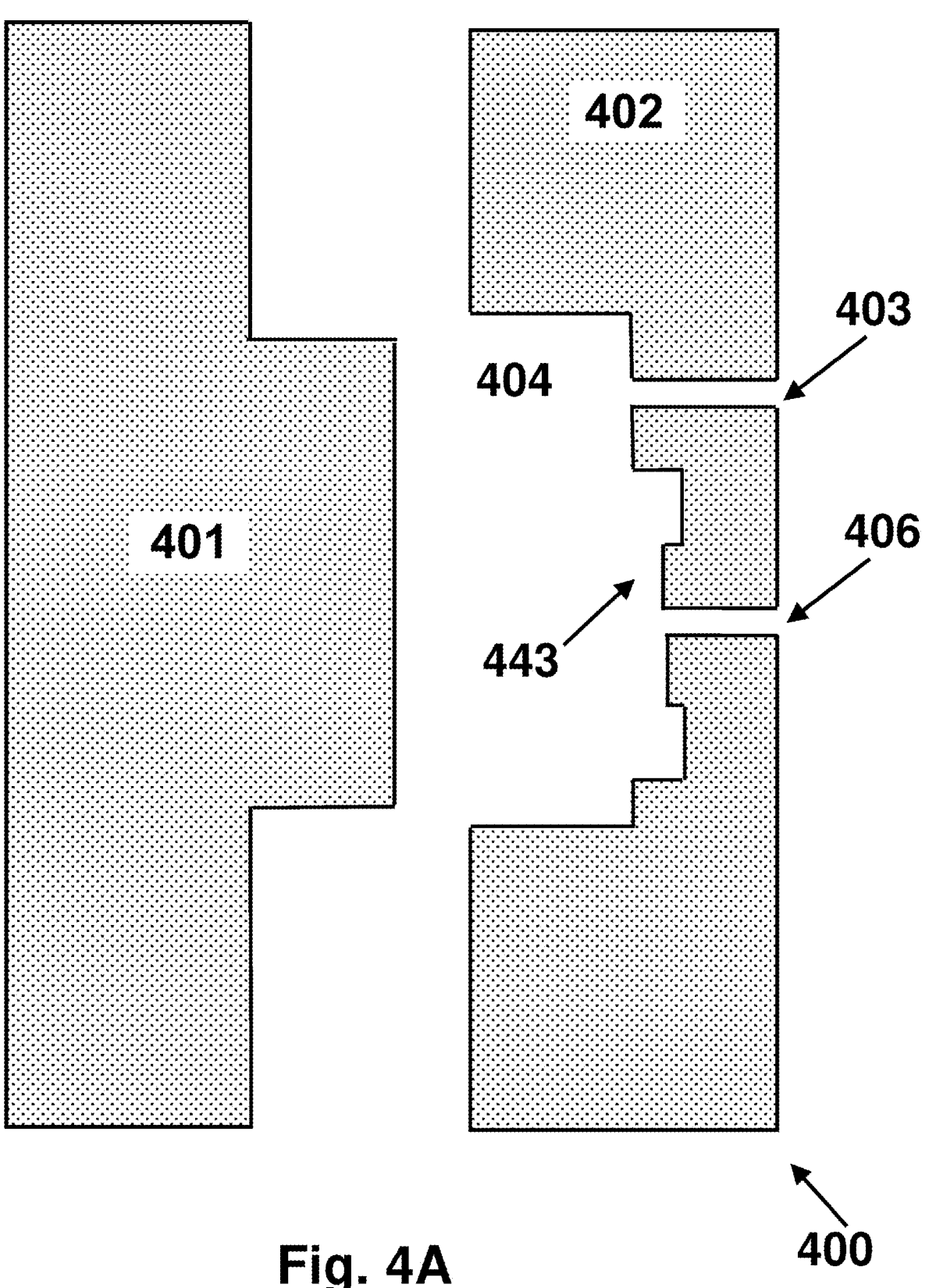

Some embodiments provide an injection-molded article or a blow-molded article or a rotational-molded article, having a Photovoltaic (PV) cell or a PV device that is integrally embedded therein and/or that is integrally incorporated therein; as well as methods and systems for producing such articles.

A solar cell, or photovoltaic (PV) cell, is a device that converts the energy of light or sunlight or photons directly into electricity by the photovoltaic effect, a physical and chemical phenomenon. Commonly used solar cells are configured as a large-area p-n junction made from silicon. Other solar cell types are, for example, thin film like CdTe or CIGS, organic solar cells, dye sensitized solar cells, perovskite solar cells, quantum dot solar cells etc.

Some solar cells operate according to the following: (1) Photons in sunlight hit the solar panel and are absorbed by semiconducting materials, such as silicon; (2) Electrons are excited by the photons from their current molecular/atomic orbital in the semiconducting material; (3) Once excited an electron can either dissipate the energy as heat and return to its orbital or travel through the cell until it reaches an electrode; (4) Current flows through the material to cancel the potential and this electricity is captured. The chemical bonds of the solar cell material are important for this process to work, and usually silicon is used in two regions, one region being doped with boron, the other phosphorus. These regions have different chemical electric charges and subsequently both drive and direct the current of electrons towards a relevant electrode.

An array of solar cells converts solar energy into a usable amount of direct current (DC) electricity. Individual solar cell devices can be combined to form modules, otherwise known as solar panels. In some cases, an inverter can convert DC current/power from a panel into alternating current (AC).

The Applicants have realized that conventional articles that include a solar cell, are typically manufactured in a multiple-step method. First, the article itself is produced or manufactured, such as from plastic. Second, the solar cell or solar panel is produced, separately and by itself; often in an entirely different location or facility; and is transported to the location or facility where the article is produced. Third, the solar cell or solar panel is connected or glued or attached to the article; for example, using glue, or using screws, or using other mechanical connection mechanism, often via manual labor, and sometimes in an automated or semi-automated connection process.

The Applicants have realized that conventional articles having PV energy generation capabilities are conventionally produced by manufacturing a finished or almost-finished or nearly-finished or essentially-finished article, and then by attached to it a solar cell or a solar panel in a subsequent manufacturing process and via a mechanical connection process.

The Applicants have realized that such conventional production methods and production system, as well as the article that results from them, may have one or more disadvantages. For example, realized the Applicants, the step of mechanical connection of the solar panel to the almost-finished article, may be labor intensive and/or time consuming and/or error prone. Additionally or alternatively, realized the Applicants, it may require delicate and/or precise manual labor, sometimes requiring manual gluing or manual utilization of screws and screwdrivers; and sometimes causing inadvertent breaking or cracking or damage to the solar cell and/or to the article itself due to such step of mechanical connection. Additionally or alternatively, realized the Applicants, the mechanical connection may be non-resilient to shocks or forces that are subsequently applied to the article (e.g., when the article is transported, installed, and/or utilized); for example, a screw-based connector may fail or may become loose or open; a glue-based connection may fall apart or may weaken due to environmental heat; or the like. Additionally or alternatively, realized the Applicants, the mechanical connection sometimes causes the final article to have visible and/or structural gaps or air-gaps that may be undesired; for example, the solar cell or solar panel is sometimes attached to the article via screws, in a manner that is not entirely tight and/or secure and/or hermetic, which allows water or liquids to flow through thin gaps that may remain between the solar cell and an adjacent region of the article; and possibly allowing such water or liquid to damage interior component(s) of the finished article. The applicants have also realized that conventional production methods of various plastic products or plastic-based products, do not allow for efficient manufacturing of an article having incorporated therein or having embedded therein a PV device or a solar cell at a curved region of the article or at a non-planar or non-flat region of the article.

The Applicants have realized that there is a need to embed, connected, integrate and/or incorporate a solar cell or a solar panel or other PV device or PV-based electricity generating unit, into an article of manufacture, in a manner that is more efficient, more secure, less prone to attachment mistakes or attachment problems, less labor consuming, and more or fully automated manner; as well as a need for producing a finished article (having such solar cell) which is more resilient to mechanical shocks and forces, and/or is more leak-proof or water-proof or liquid-proof, and/or has a secure and tight and integral connection to a surrounding or adjacent or neighboring region or part of the article itself.

Some embodiments provide methods and systems for producing an article, and particularly an article formed exclusive of plastic or formed dominantly from plastic, by performing one or more injection molding and/or blow molding and/or rotational molding process(es) such that the solar cell or solar panel or other PV device is inserted or added or placed as an "insert" item, before or during such molding process, and becomes integrally integrated or embedded or incorporated in the article during the molding process; without a subsequent need to perform a gluing step or a screwing of screws step or other mechanical connection step; and such that the molding itself, upon cooling down of the article, causes the solar panel or PV device to be integrally embedded and/or connected and/or attached and/or held in place within or on the finished article.

Some embodiments provide methods and systems for performing injection molding and/or blow molding and/or rotational molding process(es), utilizing and incorporating in the molded process a PV device or solar panel or solar cell.

In some embodiments, the PV device or solar cell or solar panel is a rigid and non-flexible; or, is flexible; or, is semi-rigid and/or semi-flexible, or is partially-rigid and/or partially-flexible; or, has an increased resilience to mechanical shocks and forces, and/or has an increased capability to absorb and/or dissipate mechanical shocks and forces.

In some embodiments, the PV device or solar cell or solar panel is planar, or is flat, or is a flat surface; in other embodiments, it is non-planar, or is curved or concave or convex, or has a three-dimensional structure other than a flat surface, or is structured to have one or more planar regions and one or more non-planar regions.

In some embodiments, particularly when non-flat or non-planar structures or contours are used, the PV device or solar cell is flexible or semi-flexible, in order to increase the ability of the PV device or solar cell to endure the stress(es) which may be encountered during the molding process, and/or to allow the PV device or solar cell to modularly adapt to a non-flat or non-planar region of the mold or the molding system.

In some embodiments, the manufacturing process may include attaching one or more PV devices to a surface of a mold; or placing, or mounting, or holding in place, such one or more PV devices onto a surface of a mold; or otherwise inserting one or more PV devices into a molding system or molding machine such that the PV device(s) are positioned in a manner and/or at a location that allows the molding process to be performed while such PV device(s) are within the machine or system. Then, the method includes performing injection molding or blow molding or rotational molding, of one or more polymer material(s) and/or plastic material(s) over the placed PV device(s); such that the molten polymer or the molten plastic attaches to (and/or surrounds) the pre-placed PV device(s), and such that the molded article and the PV device(s) become integral parts of the same, single, finished article.

In some embodiments, the molten polymer or the molten plastic is routed during the process through particular routing paths within the molding machine or systems, and/or through the mold itself and/or by using particular and pre-configured cavities for passage (or for blocking) molten plastic or molten polymer, to ensure that the molten plastic or molten polymer would surround the PV device(s), or would create a border or frame around the PV devices; yet would not cover or would not obstruct the active surface (the "sunny side") of the PV device that is configured to absorb light.

In other embodiments, the PV device may be entirely encapsulated and entirely surrounded, from all 360 degrees around it, by molten plastic and/or molten polymer, as such molten polymer or molten plastic (or, the plastic or polymer after it cools down and hardens) are transparent and/or translucent and/or allow passage of light or sunlight therethrough, thereby maintaining the PV capability of the PV device even though it is partially or entirely surrounded or encapsulated by such plastic or polymer.

In some embodiments, a plurality of such PV device(s) are electrically connected to each other, in parallel and/or in series and/or via a particular electrical circuit structure, to aggregate or accumulate or collect or build-up electric current and/or electric voltage. In some embodiments, two or more such PV devices are pre-connected to each other, electrically, prior to their placement as an "insert" in the molding places; and they remain electrically connected through and after the molding process. In other embodiments, two or more such PV devices are not electrically pre-connected to each other, prior to their placement as an "insert" in the molding places; but rather, they are placed as two or more separate "insert" items; and only after the molding process is performed, and optionally after cooling down of the molded article, the two or more PV devices are electrically connected to each other, e.g., via wires, cables, conductors, electrodes, or the like; which may be soldered or glued or bonded to conducting points or conducting regions or to electrodes of such PV devices).

In some embodiments, the single PV device that is inserted, or at least one of a series or a set or an array or an arrangement of such multiple PV devices, end or terminate with at least one set or one pair of terminals or electrodes, enabling to connect the PV device(s) to an external device (e.g., an external device that consumes and/or stores the PV-generated electricity). For example, the molded article may be a plastic box or a plastic container, or a plastic shack or shed or toolshed; and the PV device may be a set or array or matrix or series or solar panels that are integrally embedded or incorporated in a roof or ceiling or wall or panel of such box or container or shack or shed or toolshed; and the PV-generated electricity that is generated by such PV device is transferred via electrodes or wires or cables to a rechargeable battery or a rechargeable power cell that is located within the article or nearby, or is transferred to an appliance or device that consumes such PV-generated electricity or that transports it further to another electricity consuming device or electricity storage device.

In some embodiments, the manufacturing process and/or system may optionally utilize or include one or more steps or units or techniques that are sometimes used in In-Mold Labelling (IML) processes or systems; in which a label (e.g., paper label, thin plastic label) is utilized as an insert in the molding process.

In some embodiments, the one or more PV devices are manually and/or mechanically placed or mounted or held in the mold or within the mold or adjacent to the mold; and are optionally held in place (e.g., temporarily, prior to and/or during the molding process itself) by vacuum, and/or by adhesive or glue, and/or by mechanical anchoring, and/or via some other connection method or mounting method or placement method or holding method prior to introducing the molten polymer or the molten plastic to the mold.

In some embodiments, the molding may be performed using a suitable plastic material or polymer; for example, a low-density polymer, a high-density polymer, polyethylene, polypropylene, Acrylonitrile Butadiene Styrene (ABS), other suitable thermoplastic polymer(s) nylon, polystyrene, polyurethane, and/or other polymers which may be used in injection molding and/or blow molding and/or rotational molding processes.

In some embodiments, the injection molding that is used may be, for example, screw injection molding, ram injection molding, reaction injection molding, In some embodiments, the injection molding that is used may be, for example, screw-based or ram-based injection molding, e.g., that uses a screw or a ram or other component as a plunger to push or to force the molten polymer or the molten plastic into the mold cavity). For demonstrative purposes, some portions of the discussion herein may relate to injection molding that is non-reactive; however, some embodiments may comprise, or may be utilized in conjunction with, reaction injection molding or reactive injection molding, particularly utilizing polyurethane, as described herein.

In some embodiments, the injection molding that is used may be, for example, a Reaction Injection Molding (RIM) process or a Reinforced RIM process (e.g., using also one or more reinforcement materials) or a Structural RIM process (e.g., using a fiber mesh that is placed or arranged within the mold); for example, utilizing low-viscosity liquid polymer (s) (e.g., polyol and isocyanate) that expand and/or thicken via chemical reactions and harden after their injection into a heated mold, resulting in a thermosetting article. In some embodiments, PU-RIM may be used, for example, a RIM process utilizing polyurethane as one component, and using a second component which may be (for example) one or more of the following: polyol, surfactant, catalyst, blowing agent, wetting agent, emulsifier, foaming agent, dispersants, and/or other components or a blend thereof or a mixture thereof. In some embodiments, the RIM may utilize polyureas, polyisocyanurates, polyesters, polyphenols, polyepoxides, Nylon 6, and/or other suitable materials.

In some embodiments, optionally, the polymer may include one or more foaming agents or foaming materials or foam-creating agents or foam-inducing agents or blowing agents, or chemical blowing agents (e.g., isocyanate; or isocyanate and water; or azodicarbonamide; or hydrazine or nitrogen-based materials; or sodium bicarbonate); for example, in order to reduce the density of the finished article, and/or to reduce or absorb or dissipate mechanical stresses or shocks or forces in the molded article, and/or to assist in creating a lightweight article, or for other purposes.

In some embodiments, the PV device(s) are placed or held or mounted on, or at, or adjacent to, a planar or flat area or region of the mold. Additionally or alternatively, in some embodiments, the PV device(s) are placed or held or mounted on, or at, or adjacent to, a non-planar or non-flat or curved or contoured or convex or concave area or region of the mold. In some embodiments, one or more PV devices are placed or held on (or at) a planar or flat region of the mold; and also, one or more other PV devices are placed or held on (or at) a non-planar or non-flat or curved region of the same mold.

In some embodiments, a solar cell or a solar panel or a PV device has two surfaces or two sides: (A) a first surface or a first side, which is denoted as a "sunny surface" or "sunny side", or as "light-absorbing surface" or as "light absorbing side", or as "light-facing surface" or "light-facing side"; which is the side or the surface that is intended to be facing sunlight or the sun or a light source, or which is the side or the surface that is configured to absorb sunlight or light and to convert such absorbed light into electric charge(s) or electricity or electric current or electric voltage; and also, (B) a second surface or a second side, which is denoted as a "non-sunny surface" or "non-sunny side", or as a "dark surface" or "dark side", or as "non light-absorbing surface" or as "non light-absorbing side", or as "non light-facing surface" or "non light-facing side"; which is the side or the surface that is intended not to be facing sunlight or the sun or a light source, or which is opposite to and/or directed away from the "sunny side", or which is the side or the surface that is not configured to absorb sunlight or light for conversion into electric charge(s) or electricity or electric current or electric voltage. In some embodiments, a solar cell or a solar panel or a PV device is thus uni-facial or is single-facial or is one-sided, such that it can absorb light and convert it to electricity only via its "sunny side" and not via its "dark side".

In other embodiments, a solar cell or a solar panel or a PV device has two surfaces or two sides; wherein each one of them is, or can be seen as, or is configured to be operable as, a "sunny side" or a "sunny surface", facing away from each other towards opposite directions; such that the solar cell or solar panel or PV device is a bi-facial or double-facial or dual-facial, or is double-sided or double-facial, such that it can absorb and/or transfer light and convert it to electricity via each one of its two opposite surfaces or two opposite sides. Such double-sided PV device may be suitable for situations in which sunlight or light is expected or intended to reach the PV device from two or more directions, or from a direction that is not perpendicular to one of the surfaces of the PV device; for example, in a PV device that is intended to be installed generally perpendicular to the ground and may thus absorb sunlight or light from both of its sides at different times of the day, or in a PV device that is intended to be moving or rotating or spinning or otherwise changing its spatial orientation due to movement or due to other reasons.

In some embodiments, the PV device is placed or mounted or held such that its "sunny side" (the active solar material that absorbs the light and converts it to electricity) is facing the mold or is facing towards the mold. In other embodiments, the PV device is placed or mounted or held such that its "sunny side" (the active solar material that absorbs the light and converts it to electricity) is facing away from the mold.

In some embodiments, the PV device is placed or mounted or held such that its "dark side" (the non-active side) is facing the mold or is facing towards the mold. In other embodiments, the PV device is placed or mounted or held such that its "dark side" (the non-active side) is facing away from the mold.

In some embodiments, a dual-sided or double-sided PV device may be used, such that one "sunny side" thereof is facing the mold, and another "sunny side" thereof is facing away from the mold.

In some embodiments, the molten polymer(s) or the molten plastic(s) are transparent and/or translucent and/or allow at least partial passage there-through of light or sunlight. Additionally or alternatively, the hardened or solidified polymer(s), or the hardened or solidified plastic(s), are transparent and/or translucent and/or allow at least partial passage there-through of light or sunlight. This may allow, for example, partial or even complete encapsulation of the PV device by molten plastic and/or molten polymer (s), which then cool down and/or harden and/or solidify into transparent or semi-transparent or partially-transparent or translucent layer(s) of plastic or polymer; and thereby providing a finished article in which the solar cell or the PV device is tightly and securely held in place, or is even "buried" within the finished article (e.g., for increased protection against mechanical shocks), yet the PV device is operational and operable since the transparent or translucent plastic allows passage of light there-through and the light reaches the active side(s) or the "sunny side(s)" of the PV device which generate electricity.

In some embodiments, optionally, the PV device is pre-encapsulated between or within one or more layers of polymeric films or coatings; for example, Ethylene Tetrafluoroethylene (ETFE) film(s) or coating(s) or layer(s), fluorine-based plastic film(s) or coating(s) or layer(s), fluoropolymer film(s) or coating(s) or layer(s), Polyvinylidene Fluoride (PVDF) film(s) or coating(s) or layer(s), thermoplastic fluoropolymer film(s) or coating(s) or layer(s), Thermoplastic Olefin (TPO) film(s) or coating(s) or layer(s), Polyethylene (POE) film(s) or coating(s) or layer(s), Ethylene Vinyl Acetate (EVA) film(s) or coating(s) or layer(s), or a combination of two or more of the above.

In some embodiments, the molded article may be, for example, a box or container, a cooler box or cooler container (e.g., for camping) or ice chest or drinks cooler box or picnic box, or a storage unit, or a mobile home, or a shed or shack or toolshed or storage shed; and the PV device(s) may be an integrated part of a wall, a panel, a window, a door, a roof, a ceiling, or other component or region of such article.

In some embodiments, the molded article may be, for example, a roof, or a shingle, or a roof segment, or a roof cover, or a structure that is intended to cover another object (e.g., to cover a vehicle, or to cover a parking spot or a parking lot), or a pergola, or a shade structure; and the PV device(s) may be an integrated part of such article.

In some embodiments, the molded article having the PV device integrated therein may be, for example, a plastic article that is intended to cover or to protect, entirely or partially, or to be mounted on, a vehicle, a car, a truck, a bus, a train, a train car or train wagon, a motorcycle, a boat, a yacht, a drone, an airplane, a self-driving vehicle, a bicycle, an electric bicycle, or a transportation device; and the PV device(s) may be an integrated part of such article; and the article may be molded based on, or to accommodate, the three-dimensional contour or structure or shape of such object that is intended to be covered or protected; or, the article may be molded according to the contour of such existing object or vehicle (or its roof, trunk, hood, or other region) and may be placed on top of (or may be attached to) such object or vehicle or roof.

In some embodiments, the molded article having the PV device integrated therein may be, for example, a vehicular plastic article; for example, a bumper, a rear-side bumper, a front-side bumper, a plastic roof-top mounting unit (e.g., for connecting bicycles or items on top of a vehicle), a back-side mounting unit (e.g., for connecting bicycles or items behind a vehicle), a vehicular roof or roof-segment (e.g., particularly when portions of the roof are formed of plastic materials, such as a roof of a convertible car), or the like.

In some embodiments, the molded article having the PV device integrated therein may be, for example, an electronic device, an Internet of Things (IoT) device or sensor, an Internet-connected device, a home appliance, an electronic device capable of wireless communication and/or cellular communication, a smartphone, a housing for a smartphone, a tablet, a housing for a tablet, a smart-watch, a housing for a smart-watch, a laptop computer, a housing for a laptop computer, a desktop computer, a housing for a desktop computer, a security camera or an Internet-connected camera, a housing for a security camera or for an Internet-connected camera, or the like.

In some embodiments, the molded article having the PV device integrated therein may be structured and/or configured to have a sufficiently-low density to enable the article to float on water; thereby enabling to produce, for example, a floating object, a raft, a floating walkway installed between islands or regions of floating solar panels, or other floating structures.

In some embodiments, optionally, the molded article is structured or produced or shaped such that the PV device(s) are placed in one or more recessed areas or recessed regions of the article, or in inwardly-facing craters or valleys. In some embodiments, the boundaries between or among such recessed areas or craters, may be sufficiently high and/or may be sufficiently close to each other, to allow a person to walk upon the article or to allow a vehicle to drive upon the article, with no contact or with minimal (and/or temporary) contact between the person's foot (or the vehicle's tires) with the PV device(s), thereby preventing or minimizing damage to such PV devices, and thereby enabling the PV-based generation of electricity within a sidewalk, a road, a bridge, or other structure.

The terms "PV device" or "PV unit" or "PV module" or "solar cell" or "solar panel" may be used interchangeably.

In accordance with some embodiments, the molded article and the PV device(s) that are integrally embedded therein are a single, monolithic, article. For example, the PV device(s) cannot be removed or un-screwed or un-glued or detached from the molded plastic that surrounds them and that holds them, without damaging the PV device(s) themselves and/or the surrounding molded plastic, and/or without deforming or cracking at least a portion of the surrounding molded plastic. The term "monolithic" as used above and/or herein, particularly with reference to the final article or the molded article, indicates (for example) that it is a single article, a singular article, an entire article, an article that is not composed of two or more detachable components; an article whose components cannot be efficiently (or at all) un-glued or un-bonded or un-screwed from each other; an article in which the PV device is directly attached to molded plastic(s) or molded polymer(s) via the molding itself or via the molded result itself, or via a molded solidified seamless connection that is formed by the molten plastic material(s) or polymer material(s) surrounding and/or encapsulating and/or engulfing the PV device from at least some of its sides or panels; or an article that is uniform and singular such that the PV devices is integrally and uniformly integrated within or embedded within or incorporated within the solidified previously-molten or previously-melted plastic and/or polymer; or an article in which the PV device is non-detachably attached to its immediate and/or surrounding and/or adjacent regions that are formed of molded plastic and/or polymer; or an article in which there is absolutely no gap or no air gap or no space between the PV device and the molded plastic regions of the article that are immediately bordering the PV device; or an article that is not assembled from two discrete components (a plastic body, and a PV device) that are mechanically glued or screwed together, but rather, the PV device is held in place via its direct contact with the molded plastic(s) and/or polymer(s) that solidified and hardened immediately adjacent to it. In accordance with some embodiments, that does not exist an already-prepared "molded plastic body", to which a PV device is later screwed or glued; but rather, the molded plastic body is created simultaneously with, or concurrently with, or at the same time with, and/or via the same single operation of, molding the raw plastic material(s) or the raw polymeric material(s) to create, at the same time, the molded article and the molded "connection" that integrally connects the PV device to is concurrently-solidified surrounding plastic or polymer.

Reference is made to FIG. 1, which is a flow-chart of a method of producing via injection molding a plastic or polymeric article having integrated PV device(s), in accordance with some embodiments. In accordance with some embodiments, innovatively, surprisingly, and counter-intuitively, a fully operable PV device, which is an Actively Functional electric device that generates electric power from absorbed light, is incorporated or embedded in the mold and/or the molding process and/or the molding machine; and surprisingly, and counter-intuitively, the PV device remains operable and/or operational and/or functional, even though it may be exposed to or may be subject to heat and/or high temperature and/or pressure during the molding process; and the PV device, in its post-molding state, remains operational and functional, either in its entire capacity as it was prior to the molding process, or at least in a partial capacity that is still useful and sufficient for the particular purpose(s) of that PV device and/or that molded article (or another device that consumes or that stores the PV-generated electric energy).

As indicate in block 101, one or more Solar Cell(s) or PV Device(s) are attached to, or mounted or placed adjacent to, an inside region of a Mold of an injection molding machine or system; for example, by double sided adhesive, temporary adhesive, vacuum, mechanical anchor, holding pin(s), other means.

As indicated in block 102, the Mold is closed.

As indicated in block 103, hot molten plastic material(s) and/or hot molten polymer(s) are injected.

As indicated in block 104, the Mold is then cooled down; and the molded article hardens and/or solidifies.

As indicated in block 105, the method includes removing or ejecting the injection-molded article having the integrated Solar Cell(s)/PV Device(s). For example, the Solar Cell(s)/PV Device(s) are integrally incorporated in, or on, or as part of, a particular region of an external layer or external side of the injection molded article.

Reference is made to FIG. 2, which is a flow-chart of a method of producing via blow molding a plastic or polymeric article (e.g., a hollow or partially-hollow plastic or polymeric article) having integrated PV device(s), in accordance with some embodiments. In accordance with some embodiments, innovatively, surprisingly, and counter-intuitively, a fully operable PV device, which is an Actively Functional electric device that generates electric power from absorbed light, is incorporated or embedded in the mold and/or the molding process and/or the molding machine; and surprisingly, and counter-intuitively, the PV device remains operable and/or operational and/or functional, even though it may be exposed to or may be subject to heat and/or high temperature and/or pressure during the molding process; and the PV device, in its post-molding state, remains operational and functional, either in its entire capacity as it was prior to the molding process, or at least in a partial capacity that is still useful and sufficient for the particular purpose(s) of that PV device and/or that molded article (or another device that consumes or that stores the PV-generated electric energy).

As indicate in block 201, one or more Solar Cell(s) or PV Device(s) are attached to, or mounted or placed adjacent to, an inside region of a Mold of a blow molding machine or system; for example, by double sided adhesive, temporary adhesive, vacuum, mechanical anchor, holding pin(s), other means.

As indicated in block 202, a parison is formed of plastic material(s) and/or polymeric material(s). For example, the parison is a tube-like piece of plastic with a hole in one end, through which compressed air can pass and enter the parison and remain trapped in the parison.

As indicated in block 203, the parison is introduced or inserted into the mold, or (in some embodiments) may be clamped within the mold.

As indicated in block 204, the method includes blowing or inflating the parison; for example, using air and/or hot air and/or compressed air and/or pressurized air. The air pressure pushes the plastic or polymers outwardly, inflating the parison to match the structure and shape of the mold that surrounds it.

As indicated in block 205, the mold is cooled down, the blow molded article hardens and solidifies, and the mold is opened to allow removal of the blow molded article therefrom.

As indicated in block 206, the method includes removing or ejecting the blow-molded article having the integrated Solar Cell(s)/PV Device(s). For example, the Solar Cell(s)/PV Device(s) are integrally incorporated in, or on, or as part of, a particular region of an external layer or external side of the blow molded article.

Reference is made to FIG. 3, which is a flow-chart of a method of producing via rotational molding a plastic or polymeric article (e.g., a hollow or partially-hollow plastic or polymeric article) having integrated PV device(s), in accordance with some embodiments. In accordance with some embodiments, innovatively, surprisingly, and counter-intuitively, a fully operable PV device, which is an Actively Functional electric device that generates electric power from absorbed light, is incorporated or embedded in the mold and/or the molding process and/or the molding machine; and surprisingly, and counter-intuitively, the PV device remains operable and/or operational and/or functional, even though it may be exposed to or may be subject to heat and/or high temperature and/or pressure during the molding process; and the PV device, in its post-molding state, remains operational and functional, either in its entire capacity as it was prior to the molding process, or at least in a partial capacity that is still useful and sufficient for the particular purpose(s) of that PV device and/or that molded article (or another device that consumes or that stores the PV-generated electric energy).

As indicate in block 301, one or more Solar Cell(s) or PV Device(s) are attached to, or mounted or placed adjacent to, an inside region of a Mold of a rotational molding machine or system; for example, by double sided adhesive, temporary adhesive, vacuum, mechanical anchor, holding pin(s), other means.

As indicated in block 302, the mold is loaded with a "charge" or a "shot" or a pre-defined amount of raw plastic material(s) and/or raw polymeric material(s), such as raw plastic powder or raw plastic granules or raw plastic resin.

As indicated in block 303, the method includes heating and continuously rotating the Mold. The heat causes the raw plastic/polymeric materials to melt, and the rotation causes them to be pushed outwardly and coat the inner walls of the Mold.

As indicated in block 304, after a pre-defined time (e.g., five minutes) and/or after a pre-defined number of rotations, the method includes: stopping to heat the Mold, or stopping any heating of the Mold, or no longer providing any heat to the Mold; while continuing to rotate the Mold.

As indicated in block 305, after a pre-defined time (e.g., ten additional minutes) and/or after a pre-defined number of (additional) rotations, or when the temperature of the mold reaches below a pre-defined threshold temperature value, the method includes: the mold sufficiently cools down, and the rotation of the mold is stopped; and then, the Mold is opened.

As indicated in block 306, the method includes: removing or ejecting the rotational molded article having the integrated Solar Cell(s)/PV Device(s). For example, the Solar Cell(s)/PV Device(s) are integrally incorporated in, or on, or as part of, a particular region of an external layer or external side of the rotational molded article.

Reference is made to FIGS. 4A to 4G, which are schematic illustrations demonstrating components and operational steps of an injection molding system 400, in accordance with some demonstrative embodiments. In accordance with some embodiments, innovatively, surprisingly, and counter-intuitively, a fully operable PV device, which is an Actively Functional electric device that generates electric power from absorbed light, is incorporated or embedded in the mold and/or the molding process and/or the molding machine; and surprisingly, and counter-intuitively, the PV device remains operable and/or operational and/or functional, even though it may be exposed to or may be subject to heat and/or high temperature and/or pressure during the molding process; and the PV device, in its post-molding state, remains operational and functional, either in its entire capacity as it was prior to the molding process, or at least in a partial capacity that is still useful and sufficient for the particular purpose(s) of that PV device and/or that molded article (or another device that consumes or that stores the PV-generated electric energy.

In order to focus on some particular aspects of some embodiments, and in order to not obscure the drawings, conventional components of an injection molding machine are not shown, and can be used to achieve their respective functionality. For example, an injection molding machine may include an injection unit, which performs heating and injecting of molten material into a mold. The injection unit may include a hopper, which is a container that receives raw plastic material(s) or polymer(s); for example, as pellets, as granules, as powder, as blocks, as beads, as solid units, or the like. In some embodiments, optionally, the pellets or granules of raw plastic material(s) or polymer(s) may comprise one or more reinforcement elements or mechanical resilience elements or mechanical support elements or mechanical reinforcing agents, such as, glass fiber, chopped glass fiber, diced glass fiber, fibers of glass, chopped or cut fibers of glass, thin strands of glass or silica-based formulations, E-glass fibers or strands (e.g., formed of alumino-borosili-cate glass, typically with less than 1% w/w alkali oxides), A-glass fibers or strands (e.g., Alkali-lime glass with no boron oxide or with a negligible amount thereof), E-CR-glass fiber or strands (e.g., Electrical/Chemical Resistance glass fibers or strands; for example, alumino-lime silicate, typically with less than 1% w/w alkali oxides, with high acid resistance), C-glass fibers or strands (e.g., alkali-lime glass with high boron oxide content), D-glass fibers or strands (e.g., borosilicate glass, having a low Dielectric constant), R-glass fibers or strands (e.g., alumino silicate glass, without MgO and CaO, having high mechanical reinforcement prop-erties), S-glass fibers or strands (e.g., alumino silicate glass, without CaO but with high MgO content, providing high tensile strength), mica, mica crystals, mica fibers or strands, crystallized phyllosilicate mineral(s), and/or other suitable reinforcement agents or materials.

A bottom opening of the hopper transfers, or feeds, the raw material(s) into a barrel, which includes the mechanism for heating and injecting the material into the mold. A plunger or a reciprocating screw or a rotating screw or a ram injector or other suitable injection member or extruder (e.g., using electric motor or hydraulic motor) moves or pushes or advances the material(s). A heating unit or multiple heaters surround (or are adjacent to) the barrel-region or the channel through which the material(s) advance, and provide to them heat. The advancing material(s) melt due to the heat, and optionally also due to pressure and friction which contribute to such melting. The molten material(s) are injected rapidly into the mold, through an injection nozzle and via a die or opening at the end of the barrel, using an injection force provided by the buildup of pressure and/or by the rotation of the rotating screw and/or by the push forces applied to the material(s). The injected materials fill a cavity within the mold, that is defined by particularly-structured gaps between a female member and a male member of the mold. After the injection, the molten material(s) cool-down, harden and solidify within the mold, resulting in an injection-molded article. Then, the mold may be opened, and/or the injection screw (or other injection mechanism) may be retracted; and the injection-molded article may be released or extracted or ejected or otherwise released from the mold.

Prior to injection, the two members or two halves of the mold are securely closed by a clamping unit, each member affixed to a platen or a large plate. The female member of the mold may also be known as the member having the mold cavity, or as the front member or the front-side member. The male member of the mold may also be known as the rear member or the rear-side member, or as the mold core. The mold may be formed of steel or aluminum or other suitable metal(s). Optionally, multiple discrete cavities may be defined by multiple discrete gaps between the male member and the female member, and/or the three-dimensional struc-ture or shape or contour of those members.

Typically, the female member is affixed to a stationary, non-moving, front-side platen that aligns with the nozzle of the injection unit (e.g., the alignment may also be aided by locating ring). Typically, the male member is mounted on or affixed to a movable platen which may slide along tie bars or rails. Molten material(s) enter the mold cavity via the nozzle and a sprue, and move through one or more channels and/or gates and/or "runners" (which may be non-heated; or in some implementations, may be heated) which carry and/or guide and/or route the molten material(s).

The clamping unit may be equipped with a hydraulically powered clamping motor, to actuate clamping bars and/or clamping forces that keep the mold securely closed during the actual pressurized injection of molten material(s) into the mold cavity, as well as during the cooling-down period that follows the injection. After a pre-defined time period (e.g., ten minutes), the mold may be opened (e.g., by distancing the male member from the female member). An ejector bar or ejector pin or ejector plate or other ejection unit may be actuated to eject or release or remove or pull the solid injection-molded article from out of the mold cavity. Option-ally, water-based cooling or other type of cooling may be used to hasten the cooling down; for example, by running water or cold water through cooling channels that are near or adjacent to the mold. Optionally, the mold cavity is pre-configured to support or to enable flow of the molten material(s) to all the regions of the cavity that should be filled with such material(s). Optionally, a draft angle may be applied to one or more mold wall(s) or panel(s), to facilitate ejection or removal of the solid article.

In FIG. 4A, there is shown a system 400 which comprises an injection molding mold having two members: a male member 401, and a generally complementing female mem-ber 402. One or more injection port(s) 403 or other suitable injection channel(s) or injection pathway(s) or injection aperture(s) are in the female member 402, to enable injection and entry of molten polymer(s) or molten plastic material(s). A mold cavity 404 is defined between the male member 401 and the female member 402, based on their particular three-dimensional structure or shape or contour. The mold cavity 404 may have a single or a unified or a continuous cavity; or alternatively, a set of two or more discrete or separate cavities.

Figure 4B:
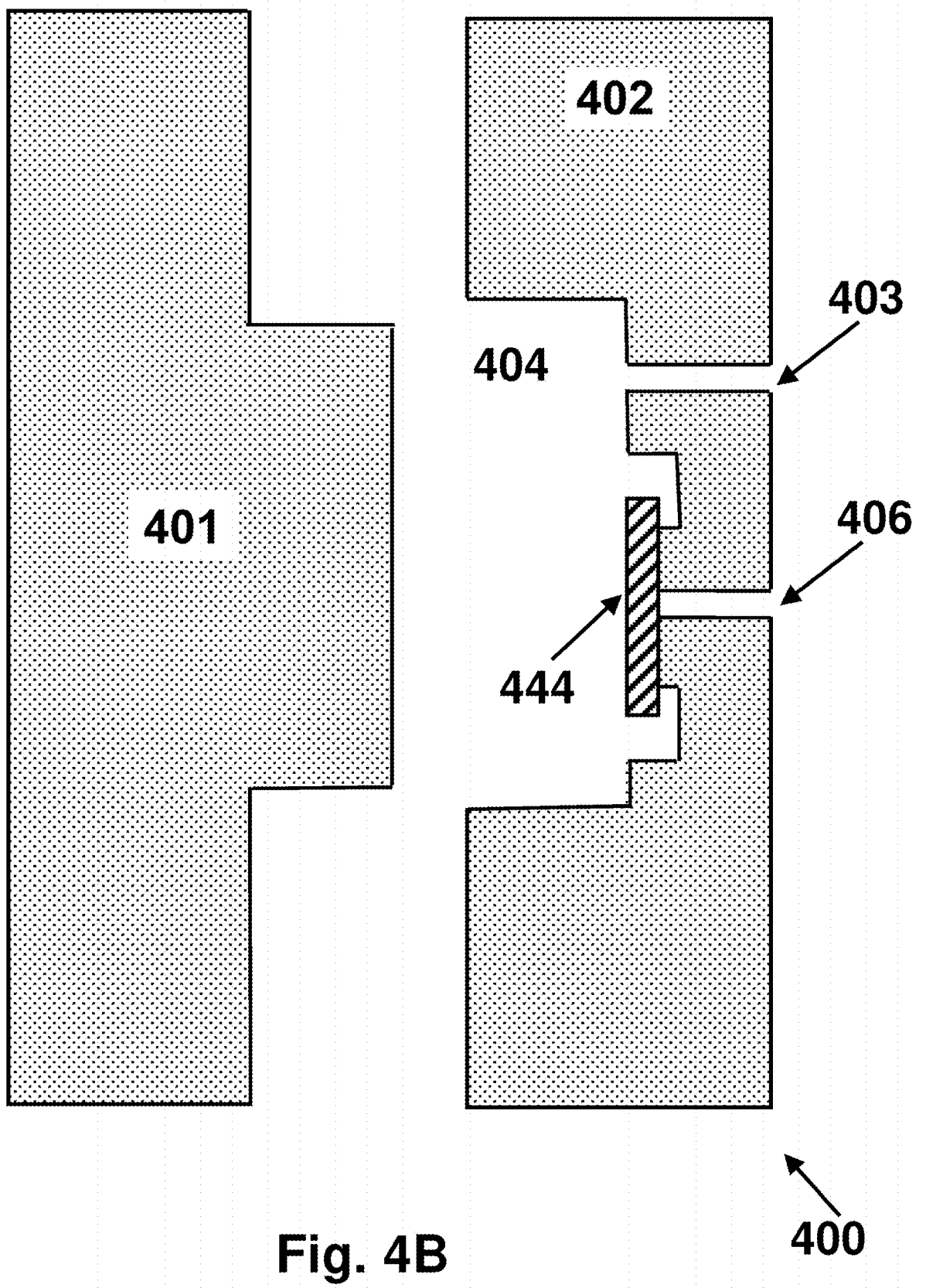

As demonstrated in FIG. 4B, a PV device 444 is placed within the mold cavity. For example, it is placed at a particular location 443 in the mold cavity 404; for example, adjacent to (or mounted on, or adhered to, or glued to) the female member 402. Optionally, a vacuum port 406 or a vacuum channel, or a suction port or channel, may be used to provide an outwardly-directed force that pushes (via vacuum or suction forces) the PV device 444 towards an inside wall or an inside panel or an inside region of the female member 402. In FIG. 4B, there is further shown a PV device 444 that is placed within the mold cavity.

Optionally, the PV device 444 may be temporarily held in place, on an inner-side wall or region of the female member, not necessarily using vacuum or suction forces; but rather, using adhesive(s), double-sided adhesive, temporary or short-term adhesive; or via magnetic forces (e.g., the PV device 444 may be magnetic north, and the female member may be magnetic south; or vice versa); or using a mechanical anchor or anchoring member or anchoring pin; or using a small pin or clasp; or by fitting the PV device 444 into a particular groove or crater or recess or recessed region in the female member that then holds in place the PV device 444 via friction and/or pressure.

Figure 4C:
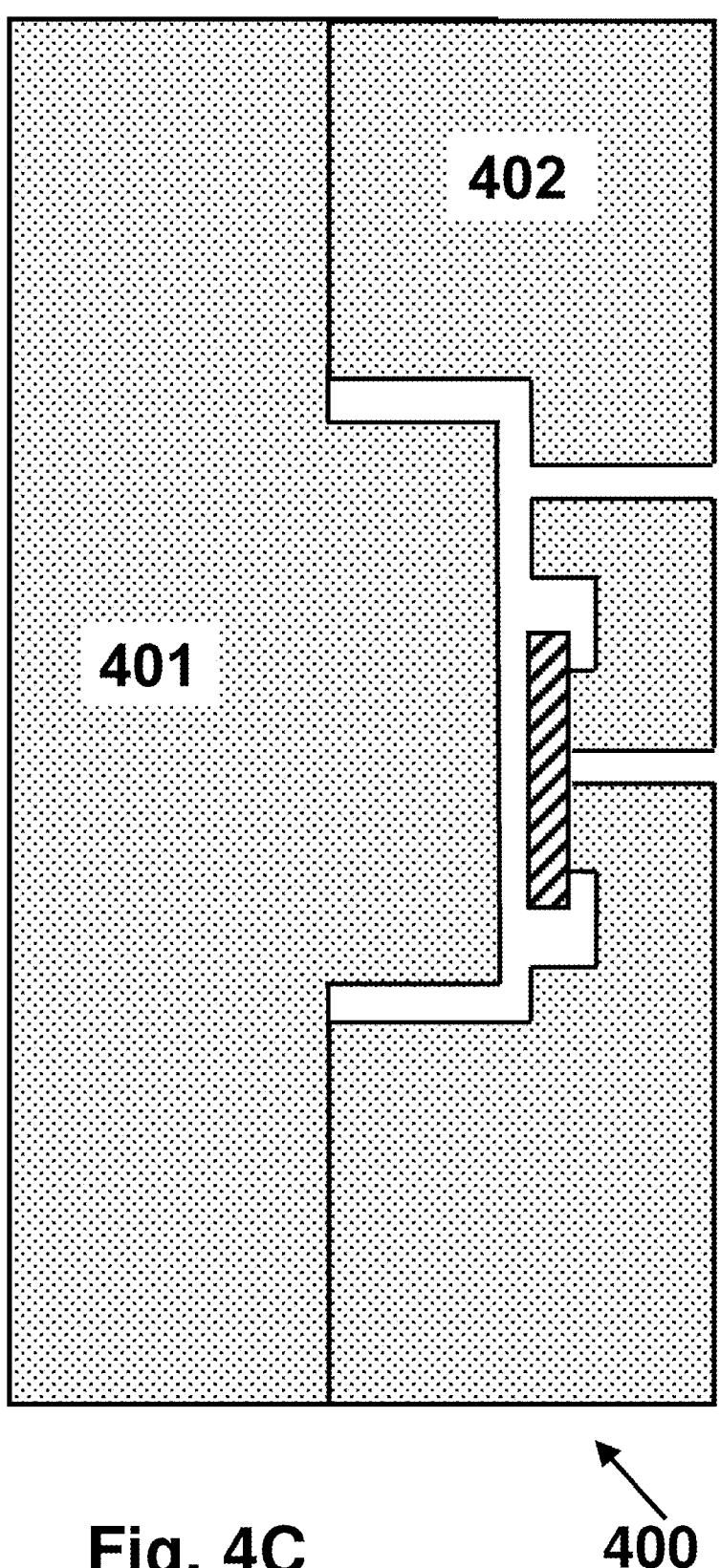

In FIGS. 4A and 4B, the mold is in an open position, such that the two mold members 401-402 are spaced apart. In FIG. 4C, the mold is shown in a closed position, such that at least some of the internally-facing region of the male member 401, directly touches at least some of internally-facing region of the female member 402; while a cavity is still defined between the two mold members 401-402 that now touch each other, upon closure of the mold and prior to injection of molten material(s).

FIG. 4D shows the system, with the molten material(s) 408 flowing into, and filling, the mold cavity of the closed mold. The molten material(s) 408 may touch the PV device 444, or may partially cover it, or may even entirely cover or encapsulate it (e.g., if transparent and/or translucent material (s) are used, to still allow at least partial passage of light towards the active parts or to a "sunny side" of the PV device 444).

Figure 4E:
Figure 4F:
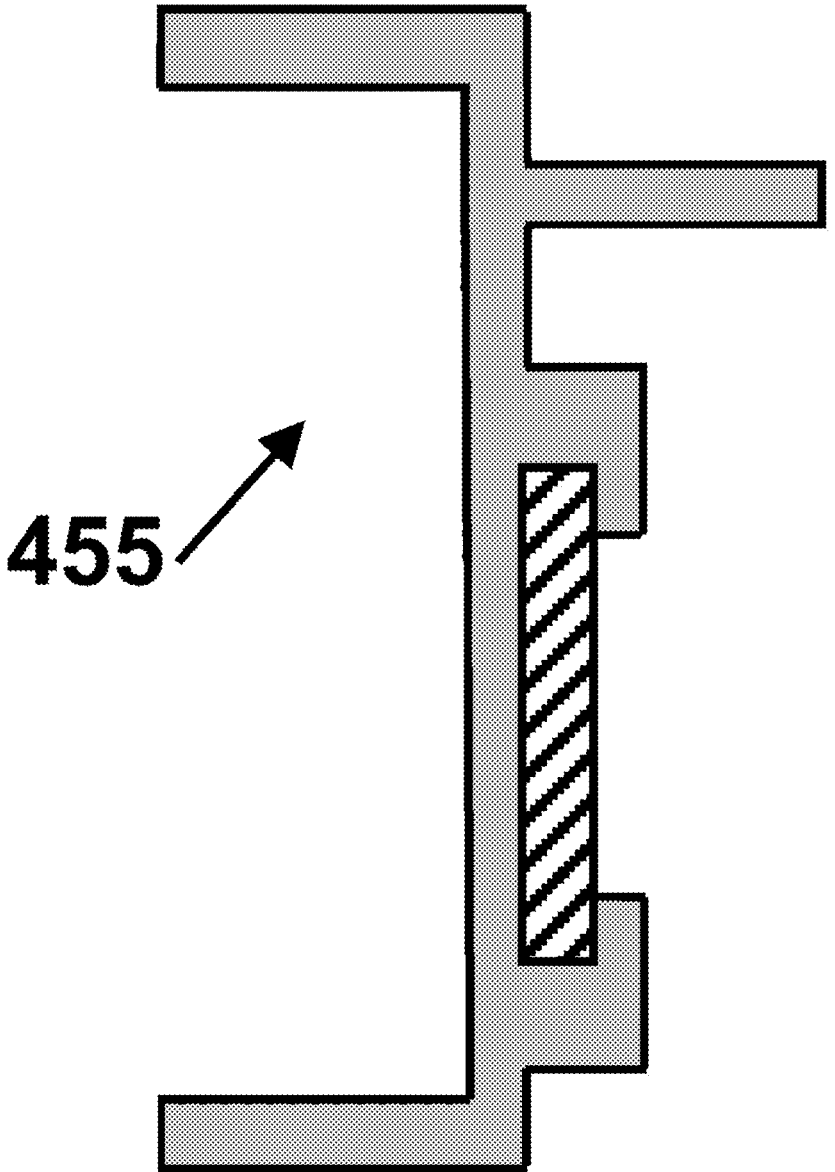

FIG. 4E shows the system after the mold cooled-down, and after the male member 401 was retracted or distanced from the female member 402, thereby opening the mold cavity. A solid, monolithic, injection-molded article 455 was created, integrally incorporating therein the PV device 444 as an integral part thereof. The PV device 444 is injection-mold connected to the other regions of the injection-molded article 455. FIG. 4F shows an enlarged view of the injection-molded article 455 as a stand-alone article, after its ejection or removal or release from the female member 402 of the mold.

Figure 4G:
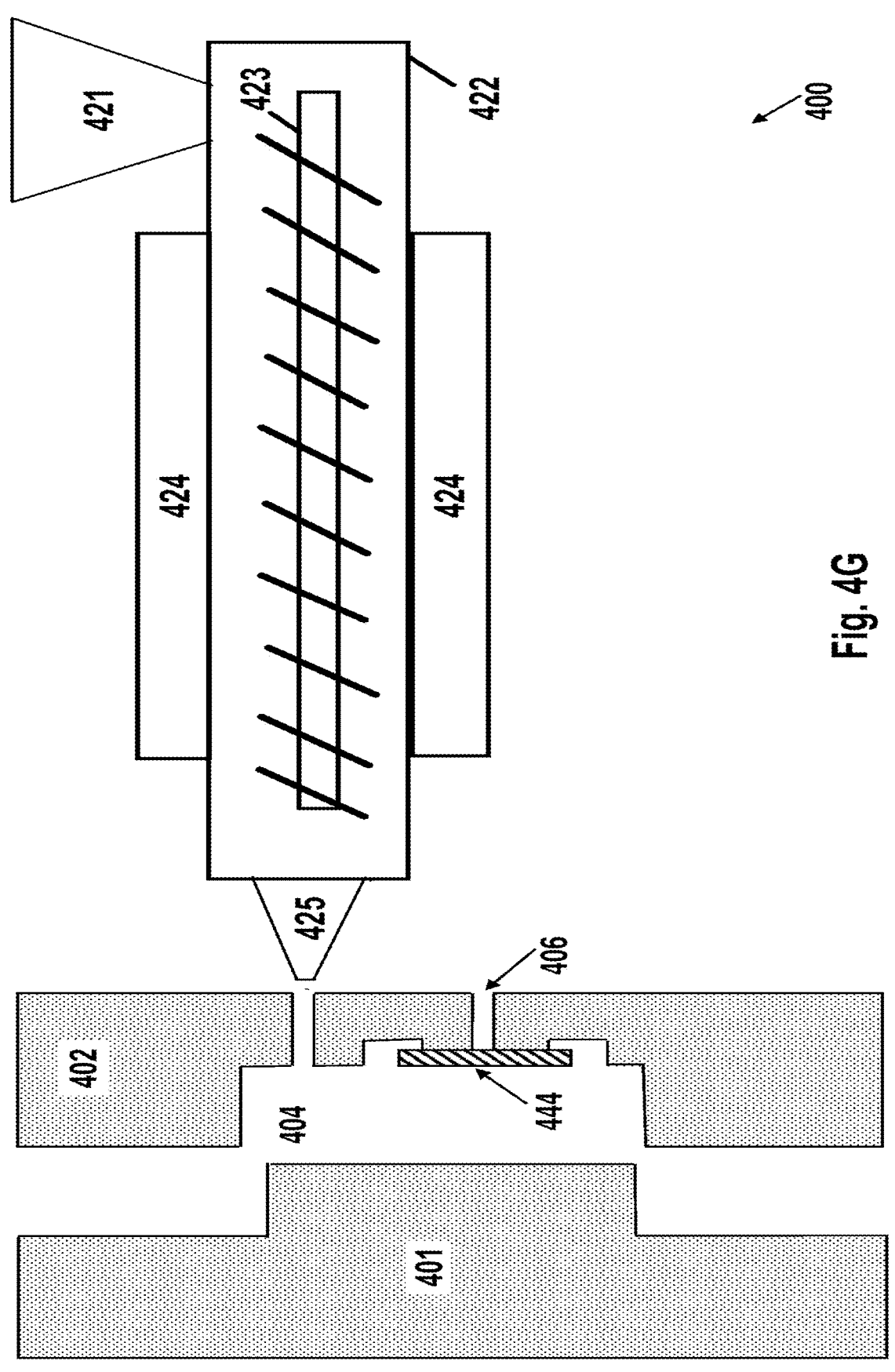

FIG. 4G shows schematically some of the above-mentioned units of system 400; for example, hopper 421 which holds raw plastic/polymeric material(s), barrel 422, screw 423, heater(s) 424, injection nozzle and die 425.

It is noted that the drawings are not necessarily drawn to scale; rather, the size of some components is intentionally exaggerated, in order to show more clearly some particular features, structures, or functionalities. For example, in some embodiments, the length or the longest dimensions of PV device 444 may range from 1 centimeter to 100 centimeters; whereas the injection molding system is typically a machine having a length in the range of 2 to 8 meters, although smaller injection molding systems or machines may be used (e.g., "lab scale" machines, having a length of 50 or 100 centimeters).

In some embodiments, blow molding or Extrusion Blow Molding (EBM) may be used, instead of injection molding. For example, raw plastic material or raw polymeric material is melted and extruded into a hollow tube, called a parison. The parison is then captured by closing it into a cooled metal mold. Air is blown into the parison, inflating it into the three-dimensional shape as defined by the metal mold. After the plastic has cooled sufficiently, the mold is opened and the formed article is ejected or removed or released. Some embodiments may utilize one or more processes such as, for example, straight EBM; or EBM with an Accumulator; or Continuous EBM; or Intermittent EBM; optionally also performing Spin Trimming. Some embodiments may perform injection blow molding (IBM), in which the polymer is injection-molded onto a core pin; then the core pin is rotated to a blow molding station to be inflated and cooled. Some embodiments may perform injection stretch blow molding, which may be a single-stage process or a double-stage process.

In some embodiments, Rotational Molding or Roto-Molding may be used, instead of injection molding. For example, it is a plastic casting technique that enables to produce a hollow or partially-hollow plastic or polymeric article. It uses a hollow mold; for example, thermoplastic powdered resin is heated while being rotated, and is then cooled to harden and solidify.

In some embodiments, the Rotational Molding does not require any injection or pressure; and may thus enable to use inexpensive machines, and may be used to produce very large articles (e.g., having a longest dimension that is larger than 1 meter, or larger than 2 meters).

In some embodiments, the Rotational Molding utilizes an arm or cradle, which carries the mold; single or multiple ovens; and cooling chambers.

In some embodiments, the Rotational Molding utilizes a Clamshell Machine: it is a single station machine, wherein molding and cooling occurs in one chamber. The mold with resin is loaded and unloaded in the chamber through a front panel. The front panel and cover are locked during heating and molding. After molding, the cover is opened to allow cooling, causing the mold to be swung out of the open oven.

In some embodiments, the Rotational Molding utilizes a Turret or Carousel Machine, which rotates at a center pivot and has three to six arms. Each arm has a mold attached to its end and passes through stations in the order of the rotational molding process, from loading, heating, cooling, and unloading, throughout the rotation of the carousel.

In some embodiments, the Rotational Molding utilizes a Shuttle Machine, which has independent arms that rotate biaxially and move the mold from loading, cooling, and unloading (combined stations) to the heating chamber located at the middle of the track. The mold returns to its original position after the process is completed.

In some embodiments, the Rotational Molding utilizes a Swing Machine, which similarly has independent arms (e.g., up to four arms); but it is not needed to operate all arms, thereby increasing production efficiency. The arms mounted at the corner of the oven rotate biaxially and swing the mold from the heating to the cooling chamber.

In some embodiments, the Rotational Molding utilizes a Vertical Wheel Machine, which operate like a Ferris wheel. The molds are contained in a cradle and are moved from loading/unloading, heating, and cooling throughout its rotation. The loading/unloading station is located at the bottom of the wheel, in between the cooling and heating areas.

In some embodiments, the Rotational Molding utilizes a "Rock and Roll" machine, which has molds contained in a cradle. The cradle swings 45 degrees back and forth on a horizontal axis, 45 degrees or below the horizontal axis while rotating 360 degrees on a perpendicular axis. Rock and Roll machines may be particularly suitable for producing an elongated article that floats on water, such as a canoe or a kayak or a marine vessel part.

The steps involved in a rotational molding operation may be as follows.

(A) Loading: A measured quantity of the polymer, such as in powdered resin form, is placed in a hollow mold and secured tightly. The powdered resin is in fine sizes, homogeneous, and dried to achieve a good flow and prevent bubble formation. The amount of resin loaded is one of the factors which determine the wall thickness of the article.

The hollow mold is made from cast aluminum or fabricated steel sheet and gives the molded part its shape.

A mold release agent is a coating present on the inner walls of the mold. It is used for effective removal or ejection of the molded article after cooling, as it prevents sticking of the molded article to the mold's inner surface.

Some types of mold release agents are, for example: (i) Sacrificial coating, such as silicone, which comes off with the molded article when it is released from the mold; and hence it is applied at the start of every loading process. (ii) Semi-permanent coating or semi-permanent mold release agent, which can last several cycles of heating and cooling of the polymer; it may be re-applied or topped up before being used up. (iii) Permanent coating, such as polytetrafluoroethylene (PTFE), which eliminates the need for re-application of a mold release agent, as it is permanently fixed on the inner mold surface; however, the permanent mold release agent layer may wear off due to scratching or mishandling.

(B) Heating and Rotating: The powdered resin is heated inside the hollow mold while being rotated slowly until all the resin is melted. As the resin melts, it coats the entire inner wall of the mold. The simultaneous action of heating and rotating ensures uniform distribution of the resin inside the mold. The mold rotates biaxially and usually at a slow speed, such as, less than 15 rotations per minute (RPM).

In some embodiments, to achieve suitable wall thickness distribution, a proper rotation ratio is determined and utilized. This value is the number of RPM on the horizontal axis over RPM on the vertical axis. For example, an article that would be generally a sphere or a cube can be molded at a rotation ratio of 4:1. For irregular shaped solids or elongated solids, the ratio may be 1:8 or 8:1, or other suitable ratio.

The heating time of the polymer is pre-defined, and is one of the parameters which determines the quality of the finished article. For example, excessive heating time may result in thermal degradation of the polymer and/or may degrade the mechanical properties of the final article, such as reduced resistance to wear and impact. In contrast, insufficient heating time would result in incomplete melting of the polymer; unmolten grains will not coalesce with the molten resin, which results in bubble formation; and such variation may have adverse effects on the mechanical properties of the article.

(C) Cooling: In the cooling stage, the molten polymer inside the mold hardens and solidifies into its desired shape. The outside of the rotational mold is cooled by natural or forced convection, usually using air or cold air. Optionally, cooling air may be supplied to the mold internals to maintain dimensional stability during cooling. Water sprays may be used to reduce the cooling time, although this may affect the mechanical properties and/or dimensions of the article.

In some embodiments, the cooling time of the polymer is as important as the heating time. Thus, the proper cooling rate may be determined and utilized. Cooling too rapidly may result in uncontrollable warpage and shrinkage of the article; whereas slow cooling may cause a flow of the molten resin, resulting in inconsistent wall thickness.

(D) Demolding or Unloading: The cooled article is removed, by a human operator or by a robotic arm or removal unit, from the hollow mold. Optionally, an air ejection unit may assist in lifting the article out of the mold.

In some embodiments, Rotational Molding may utilize polymers that are thermoplastics. Some embodiments may utilize Polyethylene, due to its low cost and/or ease of molding; it is readily available in powdered form, unlike non-polyethylene polymers which may be more difficult to grind; and It also has good chemical resistance and low water absorption. Some embodiments may utilize Polyethylene grades such as, for example, High-Density Polyethylene (HDPE), Low Density Polyethylene (LDPE), Medium Density Polyethylene (MDPE), and Linear Low-Density Polyethylene (LLDPE).

Some embodiments may utilize Polypropylene, which is a versatile polymer; having characteristics between LDPE and HDPE; having properties of chemical resistance, heat resistance, and fatigue resistance.

Some embodiments may utilize Polyvinyl Chloride, which is the polymer form of vinyl chloride monomer; it is a strong and rigid plastic, and is compatible with various additives to modify its mechanical properties.

Some embodiments may utilize Nylon, which comes from the polyamide plastic group and may be used as a molding compound; it is generally tough, with suitable thermal and chemical resistance.

In some embodiments, the raw material may be selected for rotational molding based on one or more relevant considerations. For example, the molten plastic will be exposed to oxygen at high temperatures, which may result in oxidation and loss of the desired mechanical properties of the polymer; therefore, the molecule of the polymer material should have groups with antioxidant properties. As another consideration, the polymer should have high thermal stability for the material to resist permanent changes brought by high temperatures. As another consideration, the molten material should easily flow within the walls of the mold, since flow is dependent on rotational movement only and there is no pressure involved; and thus the flow characteristics of the chosen polymer at high temperatures should be considered.

In some embodiments, primary additives may be added and used to improve the mechanical properties of the article and/or to assist in the molding process. Flow modifiers may assist in the flow of polymer resin in the molten state to achieve proper and uniform thickness distribution. Heat stabilizers may be sed to prevent thermal degradation that may be induced by high temperature. Fillers may be used to increase the stiffness; and impact modifiers may be used to increase impact strength; however, the amount of such additive may need to be controlled since they may cause rough surface and/or reduced flow. Secondary additives may also be utilized to give the finished article its characteristics, such as colorants, flame retardants, and anti-static agents.

In accordance with some embodiments, the solar cell or the PV device, that is utilized as part of the injection molding process or the RIM process or the rotational molding process or the blow molding process, is a fully-prepared or fully-operational or fully-produced or readily-functional or pre-manufactured solar cell or PV device, or a freestanding or non-supported or stand-alone or autonomous or a self-contained solar cell or PV device, which is an Active Functional Device or an Active Functional electric device that directly generates electricity from absorbed light, and that is electrically connected (e.g., via wires, cables, conductors, electrodes, electric circuit) to one or more electric energy consuming units and/or to one or more electric energy storing units.

The Applicants have discovered and realized that in accordance with some embodiments, a fully-operational or fully-operable, pre-manufactured or already-prepared, solar cell or PV device, surprisingly and counter-intuitively does not melt and/or does not get damaged and/or does not get ruined and/or does not become inoperable and/or does not break apart, when it is incorporated in an injection molding or RIM or rotational molding or blow molding process or machine or system or mold.

Surprisingly and counter-intuitively, discovered and realized the Applicants, the solar cell or PV device remains operational or operable, entirely or at least partially, or at least remains in an operational state that allows it to still produce sufficient amount of electric current and/or electric voltage and/or electric power in its post-molding state (e.g., generating and providing sufficient electric power to a power-consuming unit or device or to a power-storing unit or device), even though such solar cell or PV device has been inserted into a mold and/or a molding machine, and/or even though such solar cell or PV device has been subjected to heat or high heat or high temperatures during the molding process, and/or even though such solar cell or PV device has been subjected to pressure or high pressure or clamping pressure or other mechanical forces during the molding process.

Innovatively, the Applicants have realized that nobody has attempted to place a fully-operational or fully-operable Actively Functional device, such as the solar cell or the PV device described above and/or herein, into a mold or into a molding machine, or to embed or incorporate such device in such high-heat and/or high-pressure molding process. The Applicants have realized that conventional production methods have, at best, attempted to perform "insert molding" processes in which a Passive Mechanical Device was inserted or used; for example, a passive metal Screw, or a passive metal Nail, or a passive metal Cylinder.

In accordance with some embodiments, the solar cell or the PV device that is inserted, embedded, incorporated and/or other utilized in the molding process, is formed of semiconductor material(s) such as (for example) silicon, gallium arsenide, cadmium telluride, or other material(s). The fully-operable solar cell of PV device absorbs sunlight; and due to the PV effect, free electrons and holes are created at positive/negative junctions; and such junctions are connected via electrodes or conductors or conducting circuits or wires that collect or aggregate electric charge and generate electric current and/or electric voltage. The solar cell or PV device may be, for example, a large-area or medium-area or small-area p-n junction made from silicon; a Crystalline Silicon or c-Si solar cell or PV device; a Single Crystalline Silicon or Monocrystalline silicon solar cell or PV device; a Polycrystalline Silicon or multi-crystalline silicon solar cell or PV device; an Amorphous Silicon or a-Si solar cell or PV device, or Thin-Film solar cell or PV device; a Hybrid Silicon PV solar cell or PV device (e.g., having a combination of single crystalline silicon surrounded by thin layers of amorphous silicon), and/or other suitable type of solar cell or PV device.

In some embodiments, for example, Mono-crystalline or Poly-crystalline silicon wafers are created; for example, by cutting or wire-sawing block-cast silicon ingots into wafers (e.g., each wafer having thickness in the range of 180 to 350 micrometer). In some embodiments, the wafers are lightly p-type-doped. A surface diffusion of n-type dopants is performed on a front side (the "sunny side") of the wafer; thereby forming a p-n junction, typically located a few hundred nanometers below the surface.

Optionally, one or more anti-reflection coatings are applied, to increase the amount of light that is coupled into or absorbed by the solar cell. For example, silicon nitride may be used, or (in some implementations) titanium dioxide, due to their surface passivation properties, to prevent carrier recombination at the cell surface. For example, a coating layer (e.g., 200 to 800 nanometers thick) may be applied, using plasma-enhanced chemical vapor deposition. Optionally, the solar cell may have textured front surfaces or three-dimensional structures, that may increase the amount of light reaching the wafer.

In some embodiments, a full area metal contact is formed on the back surface (the "dark side"); and a grid-like metal contact, which includes fine "fingers" and larger "bus bars", may be screen-printed onto the front ("sunny side") surface using a silver paste. In some embodiments, rear side (or "dark side") contacts are formed by screen-printing a metal paste, such as aluminum; and such contact may cover the entire rear side, or may be a grid pattern. In some embodiments, metal paste is heated at several hundred degrees Celsius to form metal electrodes in ohmic contact with the silicon. Optionally, an additional electroplating step may be used, to increase efficiency. After the metal contacts are made, the solar cells are interconnected by flat wires and/or metal ribbons, and assembled into modules or Solar Panels. Typically, a solar panel has a sheet of tempered glass on the front (the "sunny side" surface), and a polymer encapsulation on the back (the "dark side" surface).

In some embodiments, when light or sunlight strikes the solar cell (or PV device) surface, the solar cell creates charge carrier as electrons and holes. An internal field produced by junction separates some of positive charges (holes) from negative charges (electrons). Holes are swept into positive layer or p-layer; electrons are swept into negative layer or n-layer. Individual solar cells may be connected together (electrically) to thus create a PV device or PV module or Solar Module, to increase or aggregate electric current or electric voltage; typically by connecting individual solar cells in an array or Solar Array or PV array; such as, solar arrays may be connected in parallel and thus the output electric current is increases, or solar arrays may be connected in series and thus the output electric voltage is increased, or via a different type of array or circuit having one or more region(s) or solar cells that are inter-connected in parallel and/or having one or more region(s) that are inter-connected in series.

In some embodiments, the PV device includes the Solar Cell or the Solar Module, which directly converts light into Direct Current (DC) electricity; and optionally, it includes or it is connected to a battery that is charged or recharged; optionally also connected to a Solar Charge Controller which regulates voltage and/or current from solar arrays, and/or charges a battery, and/or prevents a battery from overcharging, and/or performs controlled over-discharges; and optionally utilizing an Inverter to convert DC power output of solar arrays into AC power.

In some embodiments, optionally, the solar cell or PV device may be a mechanically-resilient and/or flexible and/or rollable and/or bendable and/or foldable solar cell or PV device; for example, due to having non-transcending gaps or "blind gaps" or craters that penetrate into from 80 to 99.9 percent of the depth of the semiconductor wafer; which provide mechanical resilience, and/or enhanced ability to absorb and/or dissipate mechanical forces and/or mechanical shocks; including, but not limited to, structures and/or components as described in U.S. Pat. No. 11,081,606 B2, which is hereby incorporated by reference in its entirety.

In some embodiments, optionally, the solar cell or PV device may be flexible, and/or may already be curved and/or non-flat and/or non-planar, prior to and/or during its insertion into the mold or into the molding machine; or, may intentionally become curved or non-planar or non-flat due to its insertion and/or placement into the mold or the molding machine; thereby allowing to produce a molded article that integrally incorporates therein or thereon, via molding of molten plastic(s) and/or molten polymer(s), such curved or non-planar or non-flat solar cell or PV device.

In some embodiments, the utilization of a solar cell or a PV device that is mechanically-resilient and/or flexible and/or rollable and/or bendable and/or foldable, may contribute to the ability of the solar cell or PV device to withstand and/or to survive, mechanically and/or thermally and/or physically and/or operably, the heat and/or pressure that are involved in the molding process; as some (or all) of such heat and/or pressure and/or mechanical forces of the molding process, may be absorbed and/or dissipated and/or mitigated by the particular three-dimensional structure of the solar cell or PV device, and particularly by the above-mentioned non-transcending craters or gaps or "blind gaps" that penetrate into between 80 to 99.9 percent of the depth or thickness (but not the entire 100 percent of the depth of thickness) of the semiconductor substrate or wafer of the PV device; and optionally, due to filler material(s) which may fill (partially, or entirely) such non-transcending gaps or craters and which may absorb mechanical forces and/or chemical forces and/or physical forces and/or heat and/or pressure(s) and/or thermal shock and/or thermal changes.

Figure 5A:
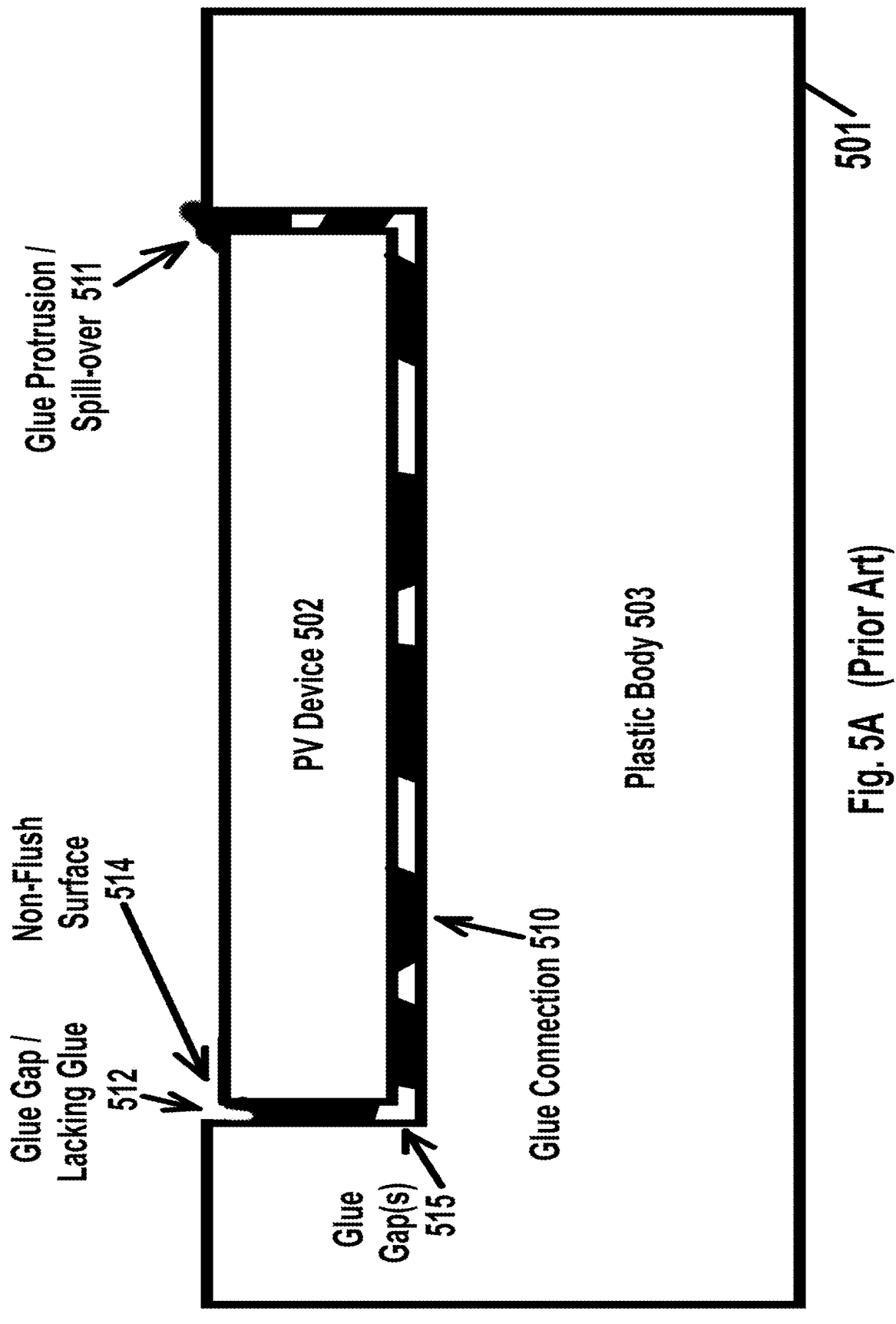
FIGS. 5A to 5C are illustrations of several prior art hybrid non-monolithic products.

Reference is made to FIG. 5A, which is an illustration of a prior art hybrid non-monolithic product 501; formed by gluing together two discrete and separate objects: (i) a PV device 502, and (ii) an already-molded plastic body 503. As shown, glue connection(s) 510 are used, depicted by black regions; but they often leave one or more Gaps 515, depicted by white spaces or white gaps between the glue regions. Accordingly, the glue-based connection is typically partial, and does not hold in place or glue the entirety of the PV device 502 but rather only portions thereof, thereby decreasing the mechanical resilience of the produce, and/or increasing the probability that the glue will fail or will weaken over time. Additionally or alternatively, such glue-based connection, which may have gaps or imperfections, may not hold the PV device securely and/or fixedly and/or hermetically.

Additionally or alternatively, a glue protrusion or over-spill 511 is shown, as an example of various glue-based imperfections that may be caused by the gluing; and such imperfection may undesirably cover the product body 503 and/or the sunny-side surface of the PV device 502 (thereby reducing its operational efficiency).

Additionally or alternatively, one or more Glue Gaps 512 are also shown, and they may occur not only within the internal side of the PV device 502, but rather they may occur also at a side or a corner thereof, such that there may exist a spatial gap or a spatial crater or an undesired indentation (arrow 512 points to it) at the top side of the product.

Additionally or alternatively, the product has a non-flush surface 514 or a non-uniform surface height, or suffers from an undesired "step"; as the PV device 502 does not exactly fit into the cavity of the pre-produced plastic body, but rather, the PV device is slightly recessed within such plastic body.

Additionally or alternatively, the PV device may be non-desirably removed from the plastic body; for example, due to mechanical shocks or forces, or due to the product falling or being subject to mechanical impacts; or due to the shaking of the product (e.g., if the product is moving or spinning, or if the user shakes or moves the product, or if the user attempts to remove the PV device from the plastic body, intentionally or unintentionally); or due to the glue weakening over time, or degrading over time due to age and/or heat and/or environmental changes (e.g., wetness, dryness, extreme temperatures).

Additionally or alternatively, small gaps or air-gaps or channels or regions that lack glue, may capture water or liquid or wetness, or sand or dust, or may trap therein non-desired materials; which may further contribute to weakening of the glue connection, and/or to shortening the life of the glue-based connection; or which may cause, directly or indirectly, damage to the PV device (e.g., trapped grains of sand may rub against the PV device's sides).

Figure 5B:
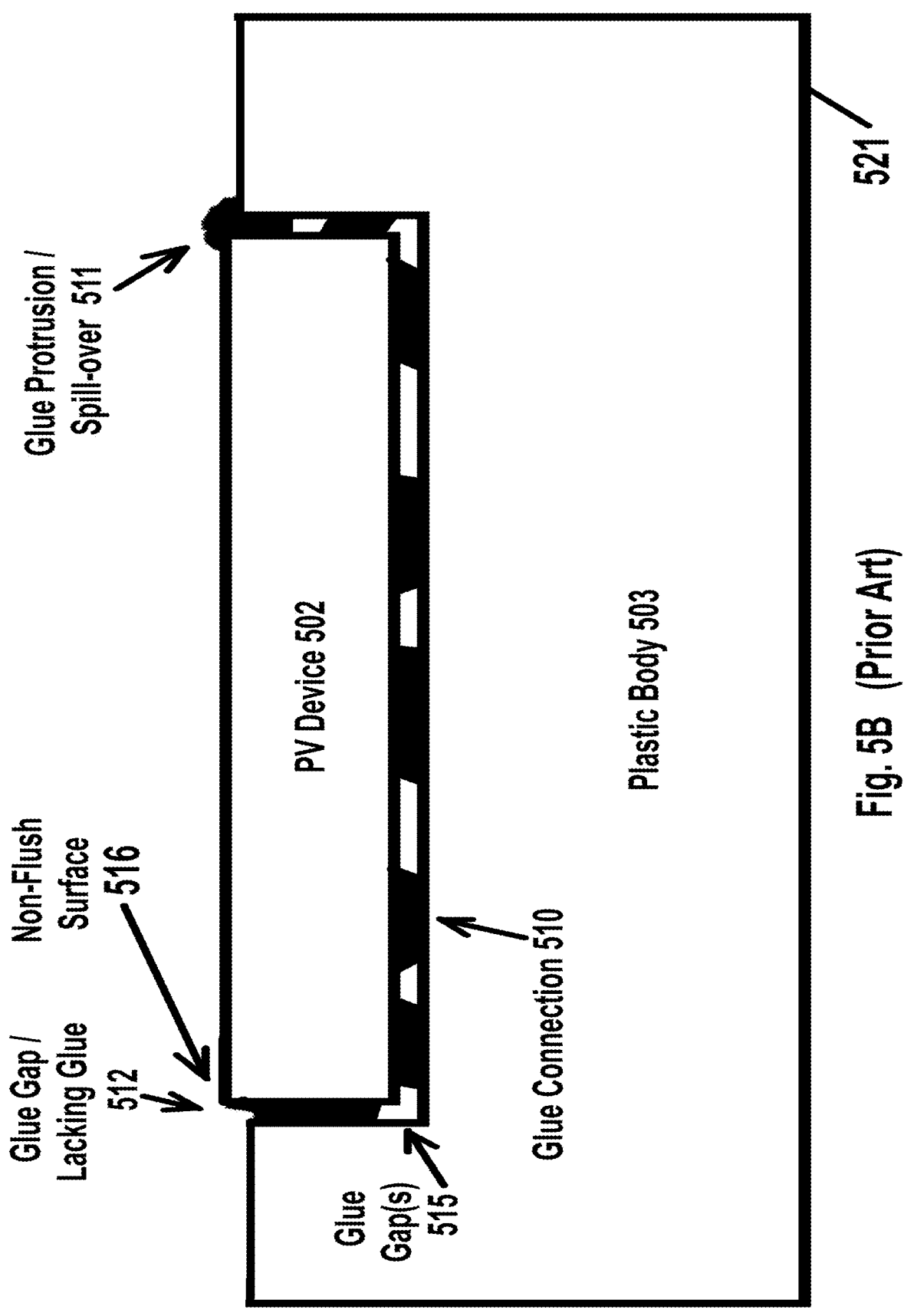

Reference is made to FIG. 5B, which is an illustration of a prior art hybrid non-monolithic product 521; formed by gluing together two discrete and separate objects: (i) a PV device 502, and (ii) an already-molded plastic body 503. As shown, this product suffers from a different type of non-flush surface 516, such that the PV device 502 is vertically higher relative to the nearby top surface of the plastic body; and such the PV device is slightly protruding out of the PV body in a non-flush structure and with a non-desired upward step surrounding the edges of the PV device.

Figure 5C:
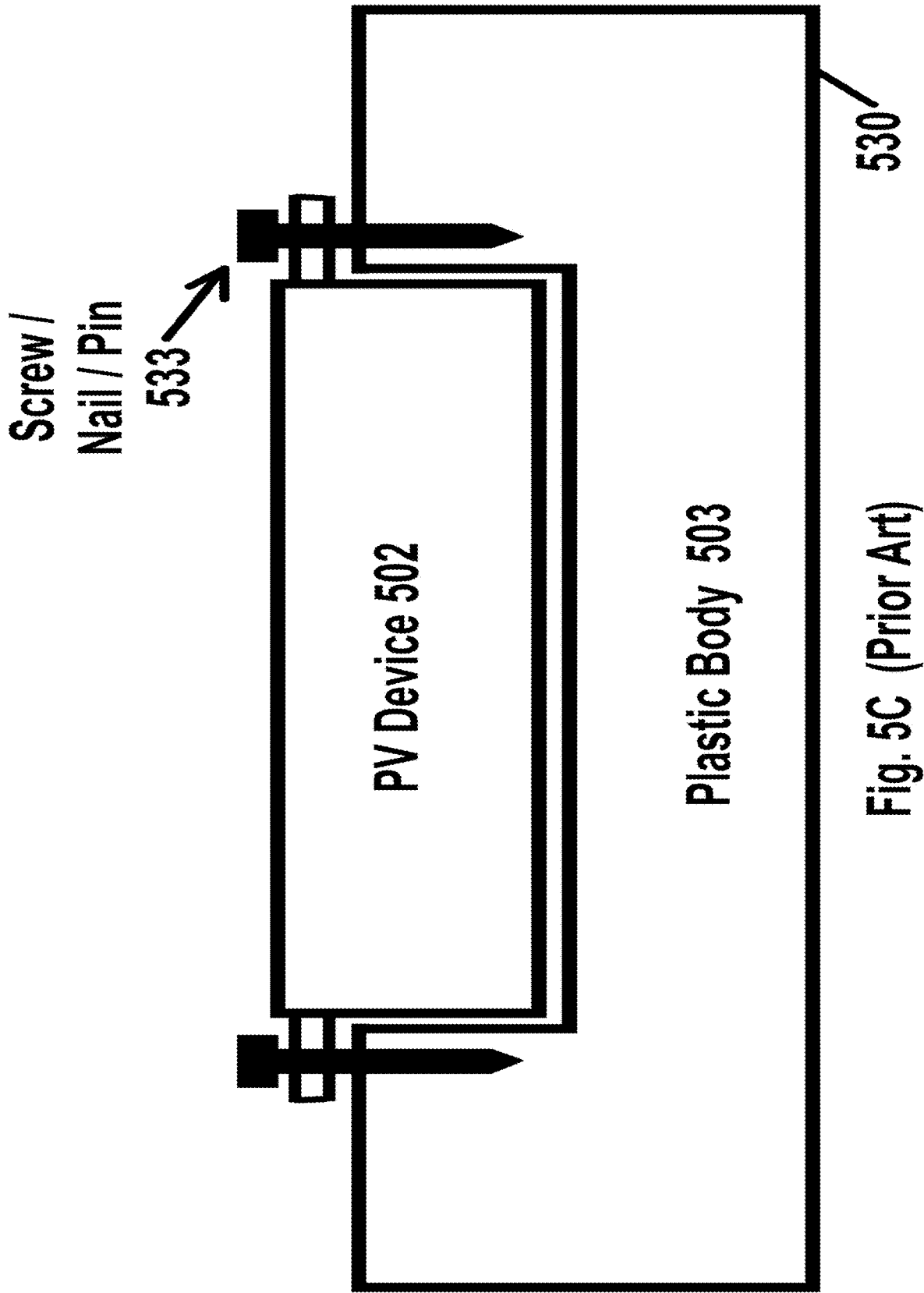

Reference is made to FIG. 5C, which is an illustration of a prior art hybrid non-monolithic product 531; formed by connecting together via a screw or nail or pin 512 (or similar mechanical connector) two discrete and separate objects: (i) a PV device 502, and (ii) an already-molded plastic body

503. As shown, this product suffers from a non-flush surface; for example, the PV device slightly protrudes upwardly out of the plastic body (as demonstrated), or conversely the PV device may be slightly recessed into the plastic body, thereby causing the product to have a non-desired non-flush surface.

Additionally or alternatively, the screw/nail/pin connection mechanism may fail due to mechanical shocks. Additionally or alternatively, and structural gaps are demonstrated (e.g., white gaps between the plastic body and the PV device), causing the PV device to be slightly movable or shaking or non-fixedly attached to the plastic body in a non-desired or imperfect manner.

Additionally or alternatively, the PV device may be non-desirably removed from the plastic body; for example, due to mechanical shocks or forces, or due to the product falling or being subject to mechanical impacts; or due to a breakage of the screw or nail or pin which may break due to mechanical forces; or due to breakage of a "tooth" or a nut or a protrusion or other element through which the screw or nail or pin is inserted; or due to intentional or non-intentional removal of the screw or pin or nail by a user (e.g., the user attempts to open a screwed chamber of the plastic product, but mistakenly unscrews the screws the connect the PV device to the plastic body).

Additionally or alternatively, small gaps or air-gaps or ai channels, may capture water or liquids or wetness, or sand or dust, or may trap therein non-desired materials; which may further contribute to weakening of the connection, and/or to shortening the life of the connection; or which may cause, directly or indirectly, damage to the PV device (e.g., trapped grains of sand may rub against the PV device's sides).

Reference is made to FIG. 6A, which is a schematic illustration of a monolithic molded article 610, in accordance with some embodiments. The monolithic article 610 includes an operable PV device 612 that is integrally embedded in or incorporated in a solidified molten plastic or polymer 613; and that is fixedly and non-removably and non-detachably held in place via a molded connection, namely, via the same molding of plastic(s) and/or polymer(s) that created the non-PV-device portion of the monolithic molded article. In some embodiments, the molded article lacks any gaps or glue gaps, or glue protrusions or glue craters, or side-gaps or bottom-side gaps. In some embodiments, the top surface is flush and perfect, and there is no under-step or over-step or recess or protrusion; and the PV device is neither recessed nor protruding relative to the nearby top-surface of the plastic regions of the article.

Reference is made to FIG. 6B, which is a schematic illustration of another monolithic molded article 620, in accordance with some embodiments. The monolithic article 620 includes an operable PV device 622 that is integrally embedded in or incorporated in a solidified molten plastic or polymer 623. This article may be generally similar to article 610 discussed above; yet one or more side-walls or side-panels or sides of the PV device 622 may be inwardly-slanted or inwardly-tapered, to achieve a particular structural or functional goal, and/or to improve or enhance or strengthen the molded connection of the PV device and the solidified molten plastic/polymer that is adjacent to it (e.g., by increasing the surface area of the PV device that is directly in touch with molten plastic/polymeric materials).

Reference is made to FIG. 6C, which is a schematic illustration of another monolithic molded article 630, in accordance with some embodiments. The monolithic article 630 includes an operable PV device 632 that is integrally embedded in or incorporated in a solidified molten plastic or polymer 633. This article may be generally similar to article 610 discussed above; yet one or more side-walls or side-panels or sides of the PV device 632 may be outwardly-slanted or outwardly-tapered, to achieve a particular structural or functional goal, and/or to improve or enhance or strengthen the molded connection of the PV device and the solidified molten plastic/polymer that is adjacent to it (e.g., by increasing the surface area of the PV device that is directly in touch with molten plastic/polymeric materials), and/or to provide a wedge-shape PV device that has increased or improved integral attachment to its surrounding.

Reference is made to FIG. 6D, which is a schematic illustration of another monolithic molded article 640, in accordance with some embodiments. The monolithic article 640 includes a curved or non-planar or non-flat operable PV device 642 that is integrally embedded in or incorporated in a solidified molten plastic or polymer 643. The solidified molten plastic or polymer, which typically (but not necessarily) forms the majority of the article, also integrally and/or fixedly and/or securely and/or hermetically holds in place the PV device, without leaving any gaps or holes or protrusions. The PV device, or its top surface or "sunny side" surface, may be curved or concave or convex, or non-planar or non-flat, or may have other three-dimensional structure. The plastic regions of the monolithic article 640 may have a particular three-dimensional shape or structure to achieve particular functional goals. In some embodiments the top surface of the PV device, is precisely flush with the top surface of the molded plastic/polymer; such that the entirety of the top surface of the article—even though it may be curved or convex or concave or non-planar—is precisely smooth, and lacks any recesses or protrusions or steps.

Reference is made to FIG. 6E, which is a schematic illustration of another monolithic molded article 650, in accordance with some embodiments. The monolithic article 650 includes an operable PV device 652 that is integrally embedded in or incorporated in or "buried in" or "trapped in" or encapsulated within a Transparent or Translucent solidified molten plastic or polymer 653. The solidified molten plastic or polymer, which typically (but not necessarily) forms the majority of the article, also integrally and/or fixedly and/or securely and/or hermetically holds in place the PV device. In this example, the top surface of the entire article is planar or generally planar; although types of structures may be used.

Reference is made to FIG. 6F, which is a schematic illustration of another monolithic molded article 660, in accordance with some embodiments. The monolithic article 660 includes a curved or concave or convex or non-flat or nonplanar operable PV device 662 that is integrally embedded in or incorporated in or "buried in" or "trapped in" or encapsulated within a Transparent or Translucent solidified molten plastic or polymer 663. The solidified molten plastic or polymer, which typically (but not necessarily) forms the majority of the article, also integrally and/or fixedly and/or securely and/or hermetically holds in place the PV device.

Some embodiments may be implemented by using a machine or an automated or semi-automatic production line, which may comprise, for example: a molding unit, an injection molding unit, a blow molding unit, a rotational molding unit, a heating unit, a storage unit, a cooling unit, an ejection unit; a placement unit or a mounting unit (e.g., to place the PV device at the exact location on the inner-side of the mold cavity or of the female member of the mold); a vacuum unit or suction unit; and/or other suitable units. The components and units of the system may be controlled by a controller or logic circuit, and optionally by a computer which may include, for example, a processor, a memory unit, a storage unit, input units (e.g., keyboard, keypad, touch-screen, touch-pad, mouse, audio microphone), output units (e.g., screen, touch-screen, audio speakers), wired and/or wireless transceivers (e.g., Wi-Fi transceiver, cellular transceiver, Bluetooth transceiver), a power source (e.g., mains electricity, battery, power cell), an Operating System (OS), drivers, applications, and/or other hardware components and/or software components.

Some embodiments provide a method comprising: producing or manufacturing or making a molded article (e.g., molded plastic article, molded polymer article) that integrally holds and/or fixedly secures and/or fixedly holds and/or tightly holds and/or non-detachably holds and/or non-removably holds and/or hermetically holds, therein (e.g., buried or trapped within the article) or thereon (e.g., such that at least one surface, particular the active or "sunny side" surface of the PV device is exposed at a corresponding surface of the molded article), an operable photovoltaic device (e.g., configured to absorb and convert light into electric power). Producing the molded article comprises: producing the molded article from a raw material, or from two or more raw materials, selected from the group consisting of: raw plastic material(s), raw polymeric material(s); by performing: (a) placing or mounting or arranging or inserting, within a mold at an inner-side of said mold cavity, an operable photovoltaic device that is able to convert light into electricity; and (b) performing a molding process that is selected from the group consisting of: injection molding, reactive injection molding, reaction injection molding, blow molding, rotational molding; wherein said performing comprises: heating and melting said raw material, and causing said material (upon its being heated and melted or molten) to acquire a shape (e.g., a particular three-dimensional shape or structure) that complements (or that corresponds to) a shape (or a three-dimensional structure) of an inner-side of said mold, and causing said operable photovoltaic device to become mechanically and integrally held and/or fixedly attached and/or securely attached and/or non-removably attached and/or non-detachably attached and/or hermetically connected in said article by adjacent (or neighboring, or directly-touching, or nearby, or surrounding) solidified molded region (or solidified molded portion) of said material; (c) after a cooling-off period of said mold and/or of said material and/or of said article and/or of the molding machine: opening said mold, and removing or extracting or ejecting or pulling-out said article from within said mold cavity; wherein said article is a solid, molded-plastic or molded-polymer article which mechanically holds integrally therein or thereon said operable photovoltaic device via molded plastic or molded polymer; for example, without using screws or nails or pins or nuts or glue or adhesive for such holding or mechanical connection.

In some embodiments, said producing comprises: providing an injection-molding mold, having a male member and a female member which together define between them a mold cavity; when the injection-molding mold is open, placing the photovoltaic device at an inner-side of the female member of the injection-molding mold; closing the injection-molding mold; injecting into said mold cavity, in an injection molding process, molten plastic material or molten polymeric material; after a cooling-down period, opening the injection-molding mold; removing, from the opened injection-molding mold, a solid, molded-plastic or molded-polymer article which holds integrally therein or thereon said photovoltaic device.

In some embodiments, said placing comprises: temporarily securing the photovoltaic device to the inner-side of the female member via suction force or vacuum force.

In some embodiments, said placing comprises: temporarily securing the photovoltaic device to the inner-side of the female member via an anchoring mechanism.

In some embodiments, said placing comprises: temporarily securing the photovoltaic device to the inner-side of the female member via an adhesive.

In some embodiments, said placing comprises: temporarily securing the photovoltaic device to the inner-side of the female member via friction force or pressure force.

In some embodiments, said placing comprises: temporarily securing the photovoltaic device to the inner-side of the female member via a magnetic force that attracts (i) the photovoltaic device to (ii) the female member of the injection-molding mold.

In some embodiments, the photovoltaic device has (i) a sunny-side surface that is configured to absorb light and convert it to electricity, and (ii) a dark-side surface that is not configured to absorb light and convert it to electricity; wherein the dark-side surface is generally opposite to the sunny-side surface; and said placing comprises: placing the photovoltaic device such that the sunny-side surface thereof is facing the inner-side of the female member of the injection-molding mold.

In some embodiments, the photovoltaic device has (i) a sunny-side surface that is configured to absorb light and convert it to electricity, and (ii) a dark-side surface that is not configured to absorb light and convert it to electricity; wherein the dark-side surface is generally opposite to the sunny-side surface; and said placing comprises: placing the photovoltaic device such that the dark-side surface thereof is facing the inner-side of the female member of the injection-molding mold.

In some embodiments, said injecting comprises: injecting said molten plastic material or molten polymeric material such that the injected material surrounds, some but not all, of the sides of the photovoltaic device; and avoiding coverage or obstructions by injected material of the sunny-side surface of the photovoltaic device.

In some embodiments, said injecting comprises: melting a raw material that is selected from the group consisting of: transparent plastic, transparent polymer, translucent plastic, translucent polymer, plastic that allows at least partial passage of light therethrough, polymer that allows at least partial passage of light therethrough; injecting molten raw material, that is transparent or translucent, to surround and to encapsulate an entirety of said photovoltaic device.

In some embodiments, said injecting comprises: melting a raw material that is selected from the group consisting of: transparent plastic, transparent polymer, translucent plastic, translucent polymer, plastic that allows at least partial passage of light therethrough, polymer that allows at least partial passage of light therethrough; injecting molten raw material, that is transparent or translucent, to cover at least some of the sunny-side surface of said photovoltaic device.

In some embodiments, said photovoltaic device is operable to convert light to electricity prior to insertion of said photovoltaic device into the injection-molding mold; wherein said photovoltaic device remains operable to convert light to electricity after it is integrated, via injection molding, into said article. It is clarified that in accordance with some embodiments, the operable PV device is regarded as "operable" when it generates electric energy from light and/or when it converts light into electric energy and/or when it is readily operable to convert light into electric energy via the PV effect; even if, or while, or when, such PV device is not necessarily yet fully wired or fully connected to another unit that collects or aggregates or consumes or stores the generated electric charge and/or the generated electric current and/or the generated electric voltage.

In some embodiments, said placing comprises: temporarily mounting the photovoltaic device on a non-planar region of the inner-side of the female member.

In some embodiments, said photovoltaic device is a non-planar photovoltaic device; and said placing comprises: temporarily placing said non-planar photovoltaic device at a non-planar region of the inner-side of the female member; wherein the injecting comprises: forming a non-planar contour of said injected-molded article immediately neighboring said photovoltaic device.

In some embodiments, performing the molding process comprises: performing a molding process that utilizes raw plastic material and/or raw polymeric material, and also one or more of: a foaming agent, a blowing agent, threads of glass fiber, chopped glass fiber, strands a mechanical reinforcement agent, threads of a mechanical reinforcement agent.

In some embodiments, performing the molding process comprises: performing a Reaction Injection Molding or a Reactive Injection Molding process that utilizes polyurethane.

In some embodiments, said injecting comprises: entirely surrounding (or trapping, or burying, or encapsulating) an entirety of said operable photovoltaic device, with injected molten raw material that is transparent or translucent; creating by injection molding a molded article having said operable photovoltaic device entirely buried therein, wherein a transparent or translucent region of said molded article enables passage of light to an active surface of said operable photovoltaic device.

In some embodiments, said producing comprises: providing a blow-molding mold, having therein a mold cavity; placing the operable photovoltaic device within the mold cavity, at an inner-side of the blow-molding mold; forming a blow-molding parison from a plastic material and/or a polymeric material; placing the blow-molding parison inside the mold cavity; blowing pressured air or pressured gas into the blow-molding parison, and inflating the blow-molding parison from an original volume to an increased volume, and causing the blow-molding parison having said increased volume to acquire a complementing shape that complements a shape of the inner-side of the blow-molding mold; after a cooling-down period: opening the blow-molding mold, and removing therefrom a solid, molded-plastic or molded-polymer article which holds integrally therein or thereon said photovoltaic device.

In some embodiments, said producing comprises: providing a rotational-molding mold, having therein a mold cavity; placing the operable photovoltaic device within the mold cavity, at an inner-side of the rotational-molding mold; inserting into the mold cavity a pre-defined amount of raw plastic material and/or raw polymeric material; continuously rotating and heating the rotational-molding mold for a first pre-defined time period (T1), and causing the raw plastic material and/or raw polymeric material to melt and to be pushed outwardly towards the inner-side of the rotational-molding mold; stopping the heating of the rotational-molding mold, and continuously rotating and heating the rotational-molding mold for a second pre-defined time period (T2), and causing the raw plastic material and/or raw polymeric material to solidify during the rotating of the second pre-defined time period (T2); after a cooling-down period: opening the rotational-molding mold, and removing therefrom a solid, molded-plastic or molded-polymer article which holds integrally therein or thereon said photovoltaic device.

In some embodiments, said placing comprises: placing said operable photovoltaic device which is flexible and rollable, and which comprises a semiconductor substrate (or semiconductor wafer) having a plurality of non-transcending craters (or non-transcending gaps, or non-transcending "bling gaps") that penetrate into, for example, from 80 percent to 99.9 percent (or, in some implementations, 85 to 99.9 percent; or 90 to 99.9 percent; or 95 to 99.9 percent), of a depth (or height, or thickness) of said semiconductor substrate (or wafer); wherein the plurality of non-transcending craters segment said semiconductor substrate and said operable photovoltaic device into a plurality of sub-regions, and provide to said operable photovoltaic device properties of absorption and dissipation of mechanical forces and/or mechanical shocks and/or mechanical pressure and/or thermal forces, and provide to said operable photovoltaic device an ability to remain operable even after being subjected to high-temperature and high-pressure molding. In some embodiments, filler material(s) may fill, partially or entirely, said non-transcending craters or at least some of them; to further increase the ability of the plurality of non-transcending craters of the PV device to absorb and/or dissipate mechanical forces and/or mechanical shocks and/or mechanical pressure and/or thermal forces, and/or to increase mechanical and/or thermal resilience of the PV device, and/or to enable the PV device to be flexible and/or rollable and/or foldable and/or bendable, and/or to enable the PV device to be curved or concave or convex or non-planar or non-flat.

Some embodiments provide a production system or a manufacturing system, comprising: a molding machine configured to produce a molded article that integrally holds therein or thereon an operable photovoltaic device; wherein the molding machine is configured to produce the molded article from a raw material selected from the group consisting of: raw plastic material, raw polymeric material; wherein the molding machine comprises: (a) a placement unit, configured to place within a mold cavity, at an inner-side of said mold cavity, an operable photovoltaic device that is able to convert light into electricity, and (b) a molding unit, configured to perform a molding process selected from the group consisting of: injection molding, blow molding, rotational molding; wherein said molding unit is configured to heat and melt said raw material, and to cause said material to acquire a shape that complements a shape of an inner-side of said mold, and to cause said photovoltaic device to become mechanically and integrally held by surrounding molding of said material; (c) a mold opening and ejection unit, that is configured to open said mold after a cooling-down period, and is configured to remove said article from within said mold cavity; wherein said article is a solid, molded-plastic or molded-polymer article which mechanically holds integrally therein or thereon said photovoltaic device via molded plastic or molded polymer.

In some embodiments, the placement unit is configured to perform placement of said operable photovoltaic device which is flexible and rollable, and which comprises semiconductor substrate having a plurality of non-transcending craters that penetrate into from 80 percent to 99.9 percent of a depth of said semiconductor substrate; wherein the plurality of non-transcending craters segment said semiconductor substrate and said operable photovoltaic device into a plurality of sub-regions, and provide to said operable photovoltaic device properties of absorption and dissipation of mechanical forces and/or mechanical shocks and/or mechanical pressure and/or thermal forces, and provide to said operable photovoltaic device an ability to remain operable even after being subjected to high-temperature and high-pressure molding.

Some embodiments provide a device or a product or a finished article or an apparatus comprising: a molded article that integrally holds therein or thereon an operable photovoltaic device; wherein the molded article is formed of a solidified previously-molten raw material selected from the group consisting of: raw plastic material, raw polymeric material; wherein the operable photovoltaic device is mechanically held and integrated by said molded article via a molded connection that molds at least two edges of said operable photovoltaic device connected via molding to one or more molded regions of said molded article; wherein the molded article, and the operable photovoltaic device, are a single monolithic article; wherein the operable photovoltaic device is held in place only via molding together with said one or more molded regions of said molded article, and not via any screws or any glue or any detachable attachment mechanism.

In some embodiments, the operable photovoltaic device has a first surface and a second, opposite surface; wherein the first surface is a sunny-side surface that is configured to absorb light and convert light to electricity; wherein the second surface is a dark-side surface that is not configured to absorb light and convert light to electricity; wherein an entirety of the sunny-side surface of the operable photovoltaic device is non-obstructed by any solidified molded plastic and/or by any solidified molded polymer; wherein solidified molded plastic and/or solidified molded polymer of said article, (i) covers and directly touches at least 50 percent of an area of the dark-side surface of the operable photovoltaic device (ii) and holds in place said operable photovoltaic device.

In some embodiments, the operable photovoltaic device has a first surface and a second, opposite surface; wherein the first surface is a sunny-side surface that is configured to absorb light and convert light to electricity; wherein the second surface is a dark-side surface that is not configured to absorb light and convert light to electricity; wherein at least 75 percent of the sunny-side surface of the operable photovoltaic device is non-obstructed by any solidified molded plastic and/or by any solidified molded polymer; wherein solidified molded plastic and/or solidified molded polymer of said article, (i) covers and directly touches at least 50 percent of an area of the dark-side surface of the operable photovoltaic device (ii) and holds in place said operable photovoltaic device.

In some embodiments, the operable photovoltaic device has a first surface and a second, opposite surface; wherein the first surface is a sunny-side surface that is configured to absorb light and convert light to electricity; wherein the second surface is a dark-side surface that is not configured to absorb light and convert light to electricity; wherein an entirety of the sunny-side surface of the operable photovoltaic device is covered by (i) solidified molded plastic of said article that is transparent or translucent, and/or (ii) solidified molded polymer of said article that is transparent or translucent.

In some embodiments, the operable photovoltaic device has a first surface and a second, opposite surface; wherein the first surface is a sunny-side surface that is configured to absorb light and convert light to electricity; wherein the second surface is a dark-side surface that is not configured to absorb light and convert light to electricity; wherein an entirety of the operable photovoltaic device is buried and encapsulated within one or more layers of (i) solidified molded plastic of said article that is transparent or translucent, and/or (ii) solidified molded polymer of said article that is transparent or translucent; wherein said one or more layers enable passage of incoming light towards the sunny-side surface of the operable photovoltaic device.

In some embodiments, the operable photovoltaic device comprises two or more discrete photovoltaic units, that are electrically inter-connected in series and/or in parallel via an electrical circuit that collects and aggregates an electric charge that is generated by photovoltaic effect. In some embodiments, the molded article comprises: a first article-region, which integrally holds via molded plastic or molded polymer, a first discrete photovoltaic unit; a second article-region, which separately integrally holds via molded plastic or molded polymer, a second discrete photovoltaic unit; wherein the first discrete photovoltaic unit and the second discrete photovoltaic unit do not directly touch each other.

In some embodiments, the operable photovoltaic device is securely and fixedly held in place within said molded article via an integrated connection that is selected from the group consisting of: an integrated injection-molded connection, an integrated blow-molded connection, an integrated rotational-molded connection. In some embodiments, the mechanical connection of the PV device to a surrounding or nearby plastic body or molded body, or the fixed holding of the PV device to such surrounding or nearby plastic body, is nail-free and/or screw-free and/or pin-free and/or glue-free and/or adhesive free.

In some embodiments, the apparatus is an apparatus selected from the group consisting of: a storage box, a cooler storage box, an ice storage box, a shed, a shack, a toolshed, a wall, a door, a roof segment, a shingle, a vehicular component, a communication device, an electronic device, a floating device.

In some embodiments, said operable photovoltaic device is flexible and rollable, and comprises a semiconductor substrate having a plurality of non-transcending craters that penetrate into from 80 percent to 99.9 percent of a depth of said semiconductor substrate; wherein the plurality of non-transcending craters segment said semiconductor substrate and said operable photovoltaic device into a plurality of sub-regions, and provide to said operable photovoltaic device properties of absorption and dissipation of mechanical forces and/or mechanical shocks and/or mechanical pressure and/or thermal forces, and provide to said operable photovoltaic device an ability to remain operable even after being subjected to high-temperature and high-pressure molding.

In some embodiments, the non-transcending craters begin at the dark-side of the PV device, and penetrate towards (but not reaching and not transcending through) the sunny-side of the PV device.

In some embodiments, the non-transcending craters begin at the sunny-side of the PV device, and penetrate towards (but not reaching and not transcending through) the dark-side of the PV device.

In some embodiments, some of the non-transcending craters begin at the sunny-side of the PV device, and penetrate towards (but not reaching and not transcending through) the dark-side of the PV device; and also, some other of the non-transcending craters begin at the dark-side of the PV device, and penetrate towards (but not reaching and not transcending through) the sunny-side of the PV device; and optionally, such non-transcending craters may be arranged in an alternating pattern or a zigzag pattern or other suitable pattern or are arranged at an offset relative to each other, such that two opposite-side non-transcending craters do not meet each other and do not cause full penetration through the entire thickness or the entire depth of the semiconductor substrate or wafer.

Functions, operations, components and/or features described herein with reference to one or more embodiments, may be combined with, or may be utilized in combination with, one or more other functions, operations, components and/or features described herein with reference to one or more other embodiments, or vice versa.

While certain features of some embodiments have been illustrated and described herein, many modifications, substitutions, changes, and equivalents may occur to those skilled in the art. Accordingly, the claims are intended to cover all such modifications, substitutions, changes, and equivalents.

What is claimed is:

1. A method comprising:
producing a molded article that integrally holds therein or thereon an operable photovoltaic device;
wherein producing the molded article comprises:
producing the molded article from a raw material selected from the group consisting of: raw plastic material, raw polymeric material,
by
(a) placing within a mold cavity, at an inner-side of said mold cavity, said operable photovoltaic device that is able to convert light into electricity, and
(b) performing a molding process selected from the group consisting of: injection molding, reactive injection molding, blow molding, rotational molding;
wherein said performing of the molding process comprises heating and melting said raw material, and causing said material to acquire a shape that complements a shape of an inner-side of said mold, and causing said operable photovoltaic device to become mechanically and integrally held in said article by adjacent solidified molten region of said material;
(c) after a cooling-down period of said mold: opening said mold, and removing said article from within said mold cavity; wherein said article is a solid, molded-plastic or molded-polymer article which mechanically holds integrally therein or thereon said operable photovoltaic device via molded plastic or molded polymer;
wherein said producing comprises:
providing an injection-molding mold, having a male member and a female member which together define between them said mold cavity;
when the injection-molding mold is open, placing the operable photovoltaic device at an inner-side of the female member of the injection-molding mold;
closing the injection-molding mold;
injecting into said mold cavity, in an injection molding process, molten plastic material or molten polymeric material;
after a cooling-down period, opening the injection-molding mold;
removing, from the opened injection-molding mold, the solid, molded-plastic or molded-polymer article which holds integrally therein or thereon said operable photovoltaic device;
wherein said placing comprises:

temporarily securing the operable photovoltaic device to the inner-side of the female member via an adhesive.

2. A method comprising:

producing a molded article that integrally holds therein or thereon an operable photovoltaic device;

wherein producing the molded article comprises:

producing the molded article from a raw material selected from the group consisting of: raw plastic material, raw polymeric material, by (a) placing within a mold cavity, at an inner-side of said mold cavity, said operable photovoltaic device that is able to convert light into electricity, and (b) performing a molding process selected from the group consisting of: injection molding, reactive injection molding, blow molding, rotational molding;

wherein said performing of the molding process comprises heating and melting said raw material, and causing said material to acquire a shape that complements a shape of an inner-side of said mold, and causing said operable photovoltaic device to become mechanically and integrally held in said article by adjacent solidified molten region of said material;

(c) after a cooling-down period of said mold: opening said mold, and removing said article from within the mold cavity; wherein said article is a solid, molded-plastic or molded-polymer article which mechanically holds integrally therein or thereon said operable photovoltaic device via molded plastic or molded polymer;

wherein said producing comprises:

providing an injection-molding mold, having a male member and a female member which together define between them said mold cavity;

when the injection-molding mold is open, placing the operable photovoltaic device at an inner-side of the female member of the injection-molding mold;

closing the injection-molding mold;

injecting into said mold cavity, in an injection molding process, molten plastic material or molten polymeric material;

after a cooling-down period, opening the injection-molding mold;

removing, from the opened injection-molding mold, the solid, molded-plastic or molded-polymer article which holds integrally therein or thereon said operable photovoltaic device;

wherein said placing comprises:

temporarily securing the operable photovoltaic device to the inner-side of the female member via a magnetic force that attracts (i) the operable photovoltaic device to (ii) the female member of the injection-molding mold.

3. The method of claim 1, wherein the operable photovoltaic device has (i) a sunny-side surface that is configured to absorb light and convert it to electricity, and (ii) a dark-side surface that is not configured to absorb light and convert it to electricity; wherein the dark-side surface is generally opposite to the sunny-side surface;

wherein said placing comprises:

placing the operable photovoltaic device such that the sunny-side surface thereof is facing the inner-side of the female member of the injection-molding mold.

4. The method of claim 1, wherein the operable photovoltaic device has (i) a sunny-side surface that is configured to absorb light and convert it to electricity, and (ii) a dark-side surface that is not configured to absorb light and convert it to electricity; wherein the dark-side surface is generally opposite to the sunny-side surface;

wherein said placing comprises:

placing the operable photovoltaic device such that the dark-side surface thereof is facing the inner-side of the female member of the injection-molding mold.

5. The method of claim 1, wherein said injecting comprises:

melting a raw material that is selected from the group consisting of: transparent plastic, transparent polymer, translucent plastic, translucent polymer, plastic that allows at least partial passage of light therethrough, polymer that allows at least partial passage of light therethrough;

injecting molten raw material, that is transparent or translucent, to surround and to encapsulate an entirety of said operable photovoltaic device.

6. The method of claim 1, wherein said injecting comprises:

melting a raw material that is selected from the group consisting of: transparent plastic, transparent polymer, translucent plastic, translucent polymer, plastic that allows at least partial passage of light therethrough, polymer that allows at least partial passage of light therethrough;

injecting molten raw material, that is transparent or translucent, to cover at least some of the sunny-side surface of said operable photovoltaic device.

7. The method of claim 1, wherein said operable photovoltaic device is operable to convert light to electricity prior to insertion of said operable photovoltaic device into the injection-molding mold;

wherein said operable photovoltaic device remains operable to convert light to electricity after it is integrated, via injection molding, into said article.

8. The method of claim 1, wherein said placing comprises:

temporarily mounting the operable photovoltaic device on a non-planar region of the inner-side of the female member.

9. The method of claim 1, wherein said operable photovoltaic device is a non-planar operable photovoltaic device;

wherein said placing comprises:

temporarily placing said non-planar operable photovoltaic device at a non-planar region of the inner-side of the female member;

wherein the injecting comprises: forming a non-planar contour of said injected-molded article immediately neighboring said operable photovoltaic device.

10. The method of claim 1, wherein performing the molding process comprises:

performing a molding process that utilizes raw plastic material and/or raw polymeric material, and also one or more of: a foaming agent, a blowing agent, threads of glass fiber, chopped glass fiber, threads of a mechanical reinforcement agent.

11. The method of claim 1, wherein performing the molding process comprises:

performing a Reaction Injection Molding or a Reactive Injection Molding process that utilizes polyurethane.

12. The method of claim 1, wherein said injecting comprises:

entirely surrounding an entirety of said operable photovoltaic device, with injected molten raw material that is transparent or translucent;

creating by injection molding a molded article having said operable photovoltaic device entirely buried therein, wherein a transparent or translucent region of said molded article enables passage of light to an active surface of said operable photovoltaic device.

13. A method comprising:

producing a molded article that integrally holds therein or thereon an operable photovoltaic device;

wherein producing the molded article comprises:

producing the molded article from a raw material selected from the group consisting of: raw plastic material, raw polymeric material, by (a) placing within a mold cavity, at an inner-side of said mold cavity, an operable photovoltaic device that is able to convert light into electricity, and (b) performing a molding process selected from the group consisting of: injection molding, reactive injection molding, blow molding, rotational molding;

wherein said performing of the molding process comprises heating and melting said raw material, and causing said material to acquire a shape that complements a shape of an inner-side of said mold, and causing said operable photovoltaic device to become mechanically and integrally held in said article by adjacent solidified molten region of said material;

(c) after a cooling-down period of said mold: opening said mold, and removing said article from within said mold cavity; wherein said article is a solid, molded-plastic or molded-polymer article which mechanically holds integrally therein or thereon said operable photovoltaic device via molded plastic or molded polymer;

wherein said producing comprises:

providing a rotational-molding mold, having therein said mold cavity;

placing the operable photovoltaic device within the mold cavity, at an inner-side of the rotational-molding mold;

inserting into the mold cavity a pre-defined amount of raw plastic material and/or raw polymeric material;

continuously rotating and heating the rotational-molding mold for a first pre-defined time period (T1), and causing the raw plastic material and/or raw polymeric material to melt and to be pushed outwardly towards the inner-side of the rotational-molding mold;

stopping the heating of the rotational-molding mold, and continuously rotating and heating the rotational-molding mold for a second pre-defined time period (T2), and causing the raw plastic material and/or raw polymeric material to solidify during the rotating of the second pre-defined time period (T2);

after said cooling-down period: opening the rotational-molding mold, and removing therefrom the solid, molded-plastic or molded-polymer article which holds integrally therein or thereon said operable photovoltaic device.

14. The method of claim 1, wherein said placing comprises:

placing said operable photovoltaic device which is flexible and rollable, and which comprises semiconductor substrate having a plurality of non-transcending craters that penetrate into from 80 percent to 99.9 percent of a depth of said semiconductor substrate;

wherein the plurality of non-transcending craters segment said semiconductor substrate and said operable photovoltaic device into a plurality of sub-regions, and provide to said operable photovoltaic device properties of absorption and dissipation of mechanical forces and/or mechanical shocks and/or mechanical pressure and/or thermal forces, and provide to said operable photovoltaic device an ability to remain operable even after being subjected to high-temperature and high-pressure molding.

* * * * *